United States Patent
Shiota et al.

(10) Patent No.: US 7,863,750 B2
(45) Date of Patent: Jan. 4, 2011

(54) SEMICONDUCTOR DEVICE CAPABLE OF SUPPRESSING WARPING IN A WAFER STATE AND MANUFACTURING METHOD THEREOF

(75) Inventors: Junji Shiota, Hamura (JP); Taisuke Koroku, Sagamihara (JP); Nobumitsu Fujii, Ome (JP); Osamu Kuwabara, Tokyo (JP); Osamu Okada, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/507,188

(22) Filed: Jul. 22, 2009

(65) Prior Publication Data

US 2010/0019371 A1    Jan. 28, 2010

(30) Foreign Application Priority Data

Jul. 24, 2008    (JP) .............................. 2008-190440

(51) Int. Cl.
*H01L 23/48* (2006.01)
*H01L 23/52* (2006.01)
*H01L 29/40* (2006.01)
*H01L 23/053* (2006.01)
*H01L 23/12* (2006.01)

(52) U.S. Cl. .................. 257/759; 257/700; 257/737; 257/738; 257/758; 257/E23.019; 257/E23.02; 257/E23.021

(58) Field of Classification Search .............. 257/700, 257/737, 738, 758, 759, E23.019, E23.02, 257/E23.021

See application file for complete search history.

(56) References Cited

U.S. PATENT DOCUMENTS

| | | | | |
|---|---|---|---|---|
| 6,559,540 | B2 * | 5/2003 | Kawashima | 257/737 |
| 6,734,568 | B2 * | 5/2004 | Matsuo et al. | 257/781 |
| 6,770,971 | B2 * | 8/2004 | Kouno et al. | 257/734 |
| 7,075,181 | B2 * | 7/2006 | Wakabayashi et al. | 257/734 |
| 7,112,883 | B2 * | 9/2006 | Hasunuma | 257/714 |
| 7,259,455 | B2 * | 8/2007 | Seto | 257/700 |
| 7,285,867 | B2 * | 10/2007 | Matsuzaki et al. | 257/787 |
| 2007/0164432 | A1 * | 7/2007 | Wakisaka et al. | 257/737 |
| 2008/0023836 | A1 * | 1/2008 | Watanabe | 257/758 |
| 2008/0217786 | A1 * | 9/2008 | Kasaoka et al. | 257/773 |
| 2009/0079072 | A1 * | 3/2009 | Mizusawa et al. | 257/738 |
| 2010/0117228 | A1 * | 5/2010 | Yamamichi et al. | 257/738 |
| 2010/0155941 | A1 * | 6/2010 | Matsuki et al. | 257/737 |

FOREIGN PATENT DOCUMENTS

JP    3455762 B2    8/2003

* cited by examiner

*Primary Examiner*—Ida M Soward
(74) *Attorney, Agent, or Firm*—Holtz, Holtz, Goodman & Chick, PC

(57) ABSTRACT

In this manufacturing method of a semiconductor device, after a sealing film is applied over an entire surface of a semiconductor wafer and hardened, a second groove for forming a side-section protective film is formed in the sealing film and on the top surface side of the semiconductor wafer. In other words, the sealing film is formed in a state where a groove that causes strength reduction has not been formed on the top surface side of the semiconductor wafer. Since the second groove is formed on the top surface side of the semiconductor wafer after the sealing film is formed, the semiconductor wafer is less likely to warp when the sealing film, made of liquid resin, is hardened.

13 Claims, 37 Drawing Sheets

US 7,863,750 B2

SEMICONDUCTOR DEVICE CAPABLE OF SUPPRESSING WARPING IN A WAFER STATE AND MANUFACTURING METHOD THEREOF

CROSS-REFERENCE TO RELATED APPLICATION

This application is based upon and claims the benefit of priority from the prior Japanese Patent Application No. 2008-190440, filed Jul. 24, 2008, the entire contents of which is incorporated herein by reference.

BACKGROUND OF THE INVENTION

1. Field of the Invention

The present invention relates to a semiconductor device in which warping is suppressed in a low wafer state and a manufacturing method thereof.

2. Description of the Related Art

A typical semiconductor device structure that is referred to as a chip size package (CSP), and a manufacturing method thereof are described in Japanese Patent No. 3455762. In the semiconductor device described in this prior patent reference, a plurality of wirings is provided on the top surface of an insulating film provided on a semiconductor substrate, columnar electrodes are provided on the top surfaces of connection pad sections of the wirings, and a sealing film is provided on the top surface of the insulating film including the wirings such that the top surface of the sealing film is flush with the top surfaces of the columnar electrodes.

In this instance, to prevent the exposure of the upper section of the peripheral surface and the bottom surface of the semiconductor substrate, the upper section of the peripheral surface of the semiconductor substrate is covered with a sealing film, and the bottom surface of the semiconductor substrate is covered with a lower-layer protective film.

In the conventional manufacturing method of the semiconductor device described above, first, a semiconductor substrate in a wafer state (hereinafter, referred to as a semiconductor wafer) on top of which the insulating film, the wirings, and the columnar electrodes are formed is prepared. Next, the bottom surface of the semiconductor wafer is adhered to the top surface of a lower-layer insulating film provided on the top surface of a dicing tape with a release sheet therebetween.

Next, a groove having a predetermined width is formed by half-cutting between each semiconductor device formation area on the top surface side of the semiconductor wafer. A sealing film is then formed within the groove and on the top surface of the insulating film including the wirings such that the thickness of the sealing film is thicker than the height of the columnar electrodes. Next, the top surface side of the sealing film is ground, and after the top surfaces of the columnar electrodes are exposed, the top surface of the sealing film including the top surfaces of the columnar electrodes is planarized.

Next, the sealing film, the semiconductor wafer, and the lower-layer protective film are cut at the center of the groove in the width direction. A support tape is then adhered to the top surfaces of the sealing film and the columnar electrode. The dicing tape and the release sheet are then peeled. As a result, a semiconductor device is obtained that has a structure in which the upper section of the peripheral side surface of the semiconductor substrate is covered by the sealing film and the bottom surface of the semiconductor substrate is covered by the lower-layer protective film.

However, in the conventional manufacturing method of the semiconductor device described above, the sealing film is formed in the groove and on the top surface of the insulating film including the wirings after the groove is formed on the top surface side of the semiconductor wafer by half-cutting. In other words, the sealing film is formed in a state where the strength of the semiconductor wafer is weakened as a result of the groove being formed. Therefore, there is a problem that, when the sealing film made of thermosetting resin such as epoxy system resin is hardened, the semiconductor wafer is relatively significantly warped.

SUMMARY OF THE INVENTION

The object of the present invention is to provide a semiconductor device in which a semiconductor wafer is less likely to warp when a sealing film made of thermosetting resin such as epoxy system resin is hardened, and a manufacturing method thereof.

In order to achieve the above-described purpose, in accordance with one aspect of the present invention, there is provided a semiconductor device comprising: a semiconductor substrate; a low dielectric constant film and wiring laminated structure section having a laminated structure including a low-dielectric film having a dielectric constant of 3.0 or less and a wiring, which is provided on one surface of the semiconductor substrate excluding a periphery thereof; and an insulating film provided on the low dielectric constant film and wiring laminated structure section. Also, the semiconductor device comprises an electrode connection pad section provided on the insulating film; and an external connection bump electrode provided on the electrode connection pad section. Furthermore, the semiconductor device comprises a sealing film made of organic resin provided on the insulating film around a periphery of the external connection bump electrode, a side surface of the insulating film, and a side surface of the low dielectric constant film and wiring laminated structure section; a side-section protective film made of organic resin provided on a side surface of the sealing film and at least an upper section of a side surface of the semiconductor substrate; and a lower-layer protective film made of organic resin provided on at least a bottom surface of the semiconductor substrate.

In accordance with another aspect of the present invention, there is provided a manufacturing method of a semiconductor device, comprising the steps of: preparing a semiconductor wafer including a bump electrode in which an insulating film is formed on top of one surface of the semiconductor wafer, an electrode connection pad section is formed on the insulating film, and an external connection bump electrode is formed on top of the electrode connection pad section; forming a sealing film made of organic resin on the insulating film around a periphery of the external connection bump electrode; and forming a groove in the sealing film and on a top surface side of the semiconductor wafer in an area including a dicing street and both sides of the dicing street. Also, the manufacturing method comprises the steps of: forming a side-section protective film formation film made of organic resin within the groove and on the sealing film such that a top surface of the external connection bump electrode is exposed; and forming a side-section protective film within the groove. Furthermore, the manufacturing method comprises the steps of: reducing a thickness of the semiconductor wafer by grinding a bottom surface side of the semiconductor wafer; and forming a lower-layer protective film made of organic resin on at least a bottom surface of the semiconductor wafer. As a result, a plurality of individual semiconductor devices is obtained by cutting at least the side-section protective film along the dicing street in the center of the groove.

In accordance with another aspect of the present invention, there is provided a manufacturing method of a semiconductor device, comprising the steps of: preparing a semiconductor wafer in which a low dielectric constant film and wiring laminated structure section having a laminated structure including a low-dielectric film having a dielectric constant of 3.0 or less and a wiring, and a plurality of insulating film sections formed separately from one another on the low dielectric constant film and wiring laminated structure section are formed on one surface; and forming a groove that reaches the one surface of the semiconductor wafer by irradiating, with a laser beam, the low dielectric constant film and wiring laminated structure section exposed between the insulating film sections. Also, the manufacturing method comprises the steps of: forming a sealing film made of organic resin within the groove and on the insulating film sections; forming a groove in the sealing film and on a top surface side of the semiconductor wafer; forming a side-section protective film formation film made of organic resin within the groove and on the sealing film such that a top surface of the external connection bump electrode is exposed; and forming a side-section protective film within the groove. Furthermore, the manufacturing method comprises the steps of: reducing a thickness of the semiconductor wafer by grinding a bottom surface side of the semiconductor wafer; and forming a lower-layer protective film made of organic resin on at least a bottom surface of the semiconductor wafer. As a result, a plurality of individual semiconductor devices is obtained by cutting at least the side-section protective film along the groove.

According to the present invention, a sealing film is formed in a state where a groove that causes strength reduction has not been formed on the top surface side of the semiconductor wafer, and after the sealing film is formed, the groove is formed on the top surface side of the semiconductor wafer. Therefore, the semiconductor wafer is less likely to warp when the sealing film made of thermosetting resin such as epoxy system resin is hardened.

The above and further novel features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

The present invention will hereinafter be described in detail with reference to the preferred embodiments shown in the accompanying drawings.

First Embodiment

Figure 1:
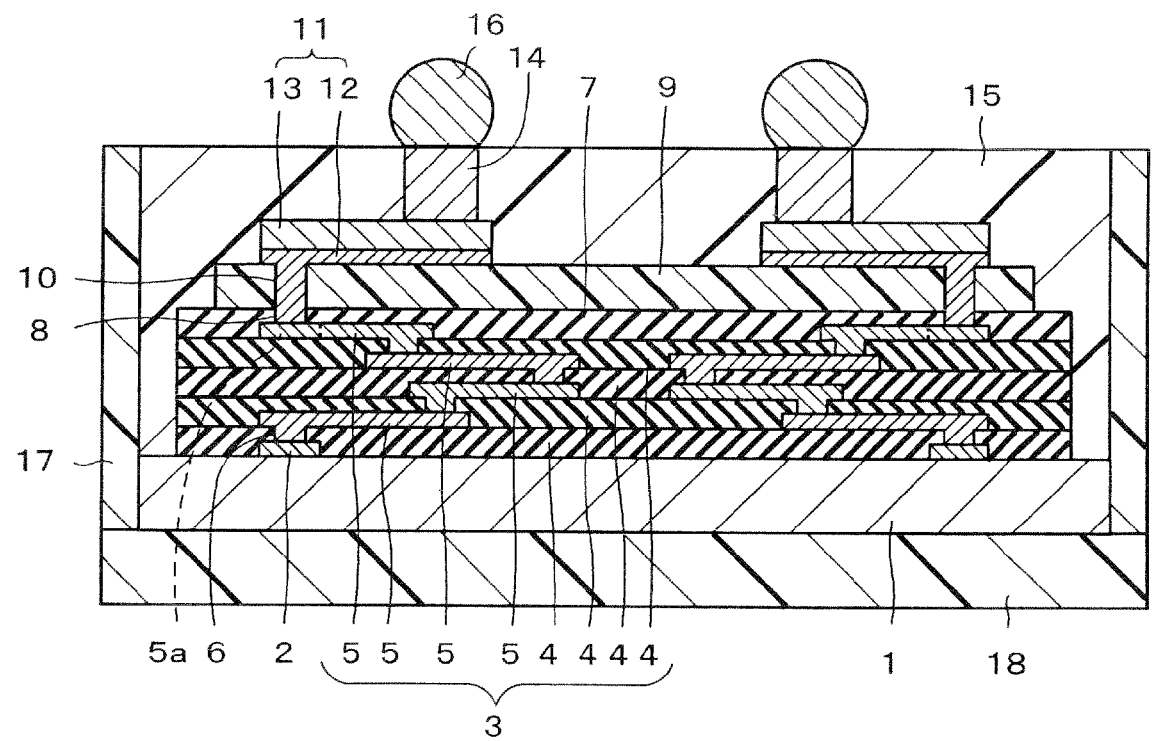
FIG. 1 is a cross-sectional view of a semiconductor device according to the first embodiment of the present invention.

FIG. 1 is a cross-sectional view of a semiconductor device according to the first embodiment of the present invention. The semiconductor device includes a silicon substrate (semiconductor substrate) 1. An integrated circuit, particularly elements such as a transistor, a diode, a resistor, and a capacitor (not shown), providing a predetermined function is formed on the top surface of the silicon substrate 1, and connection pads 2 made of aluminum series metal or the like which are connected to each element in the integrated circuit are provided on the top surface periphery of the silicon substrate 1. Although only two connection pads 2 are shown in FIG. 1, in actuality, numerous connection pads 2 are arrayed on the top surface of the silicon substrate 1.

A low dielectric constant film and wiring laminated structure section 3 for interconnecting each element in the integrated circuit is provided on the top surface of the silicon substrate 1 in an area excluding the periphery on the outer sides of the connection pads 2. The low dielectric constant film and wiring laminated structure section 3 is configured such that multi-layered, for example, four-layered low-dielectric films 4, and wirings 5 made of, for example, copper or aluminum series metal having the same number of layers are alternately laminated. The low-dielectric films 4 are used to recover increase in the delay of signals sent over the wirings 5. The increase of this delay is caused by increased capacity between the wirings 5 due to shortened distance between the wirings 5 as a result of miniaturization.

Polysiloxane material including a Si—O coupling and a Si—H coupling (hydrogen silsesquioxane [HSQ]; dielectric constant of 3.0), polysiloxane material including a Si—O coupling and a Si—CH3 coupling (methyl silsesquioxane [MSQ]; dielectric constant of 2.7 to 2.9), carbon-doped silicon oxide (SiOC; dielectric constant of 2.7 to 2.9), organic low-k polymer material, and the like are given as materials for the low-dielectric film 4. A material having a dielectric constant of 3.0 or less and a glass transition temperature of 400° C. or more is usable.

"SiLK (dielectric constant of 2.6)" manufactured by The Dow Chemical Company, "FLARE (dielectric constant of 2.8)" manufactured by Honeywell Electronic Materials, and the like are given as the organic low-k polymer material. Here, the glass transition temperature is required to be 400° C. or more so that the material can sufficiently withstand temperatures during the manufacturing process described hereafter. Note that porous versions of above-mentioned materials may also be used.

In addition to the above-mentioned materials, a material having a dielectric constant exceeding 3.0 in an ordinary state but having a dielectric constant of 3.0 or less and a glass transition temperature of 400° C. or more in porous version may be used as the material for the low-dielectric film 4. For example, fluorinated silicate glass (FSG; dielectric constant of 3.5 to 3.7), boron-doped silicate glass (BSG; dielectric constant of 3.5), and silicon oxide (dielectric constant of 4.0 to 4.2) may be used.

In the low dielectric constant film and wiring laminated structure section 3, the wiring 5 of each layer is interconnected between layers One end section of the wiring 5 of the bottommost layer is connected to the connection pad 2 by an opening 6 provided in the low-dielectric film 4 of the bottommost layer. A connection pad section 5a of the wiring 5 of the uppermost layer is arranged on the top surface periphery of the low-dielectric film 4 of the uppermost layer.

A passivation film (insulating film) 7 made of an inorganic material such as silicon oxide is provided on the top surfaces of the wiring 5 of the uppermost layer and the low-dielectric film 4 of the uppermost layer. An opening 8 is provided in the passivation film 7 in a section corresponding to the connection pad section 5a of the wiring 5 of the uppermost layer. An upper-layer protective film (insulating film) 9 made of organic resin such as polyimide system resin is provided on the passivation film 7 in an area excluding the top surface periphery. An opening 10 is formed in the upper-layer protective film 9 in a section corresponding to the opening 8 in the passivation film 7.

An upper-layer wiring 11 is provided on the top surface of the upper-layer protective film 9. The upper-layer wiring 11 has a two-layered structure including a base metal layer 12 made of copper and the like which is provided on the top surface of the upper-layer protective film 9, and an upper metal layer 13 made of copper which is provided on the top surface of the base metal layer 12. One end section of the upper-layer wiring 11 is connected to the connection pad section 5a of the wiring 5 of the uppermost layer via the openings 8 and 10 formed in the passivation film 7 and the upper-layer protective film 9.

A columnar electrode (external connection bump electrode) 14 made of copper is provided on the top surface of the connection pad section (electrode connection pad section) of the upper-layer wiring 11. A sealing film 15 made of organic resin such as epoxy system resin is formed on the peripheral side surfaces of the low dielectric constant film and wiring laminated structure section 3, the passivation film 7, and the upper-layer protective film 9, and on the top surface of the upper-layer protective film 9 including the upper-layer wiring 11, such that the top surface of the sealing film 15 is flush with the top surface of the columnar electrode 14 ("flush with" herein means that these two top surfaces are flat as one continuous surface, and herein after the same). A solder ball 16 is provided on the top surface of the columnar electrode 14.

Here, the side surfaces of the low dielectric constant film and wiring laminated structure section 3 and the passivation film 7 are substantially flush with each other and covered by the sealing film 15. Also, the side surfaces of the silicon substrate 1 and the sealing film 15 are substantially flush with each other and covered by a side-section protective film 17 made of organic resin such as epoxy system resin. Furthermore, the bottom surface of the side-section protective film 17 is flush with the bottom surface of the silicon substrate 1. A lower-layer protective film 18 made of organic resin such as epoxy system resin is provided on the bottom surfaces of the silicon substrate 1 and the side-section protective film 17.

As described above, in this semiconductor device, the side surfaces of the silicon substrate 1 and the sealing film 15 are covered by the side-section protective film 17. Therefore, the side surface of the silicon substrate 1 is protected from cracks and the like. Also, the bottom surfaces of the silicon substrate 1 and the side-section protective film 17 are covered by the lower-layer protective film 18. Therefore, the bottom surface of the silicon substrate 1 is protected from cracks and the like.

In addition, in this semiconductor device, the low dielectric constant film and wiring laminated structure section 3 having the laminated structure including the low-dielectric films 4 and the wirings 5 is provided on an area of the silicon substrate 1 excluding its periphery, and the side surfaces of the low dielectric constant film and wiring laminated structure section 3 and the passivation film 7 are covered by the sealing film 15. Therefore, a structure is achieved in which the low dielectric constant film and wiring laminated structure section 3 is not easily peeled off the silicon substrate 1.

FIRST EXAMPLE OF THE MANUFACTURING METHOD

Next, a first example of a manufacturing method of the semiconductor device will be described.

Figure 2:
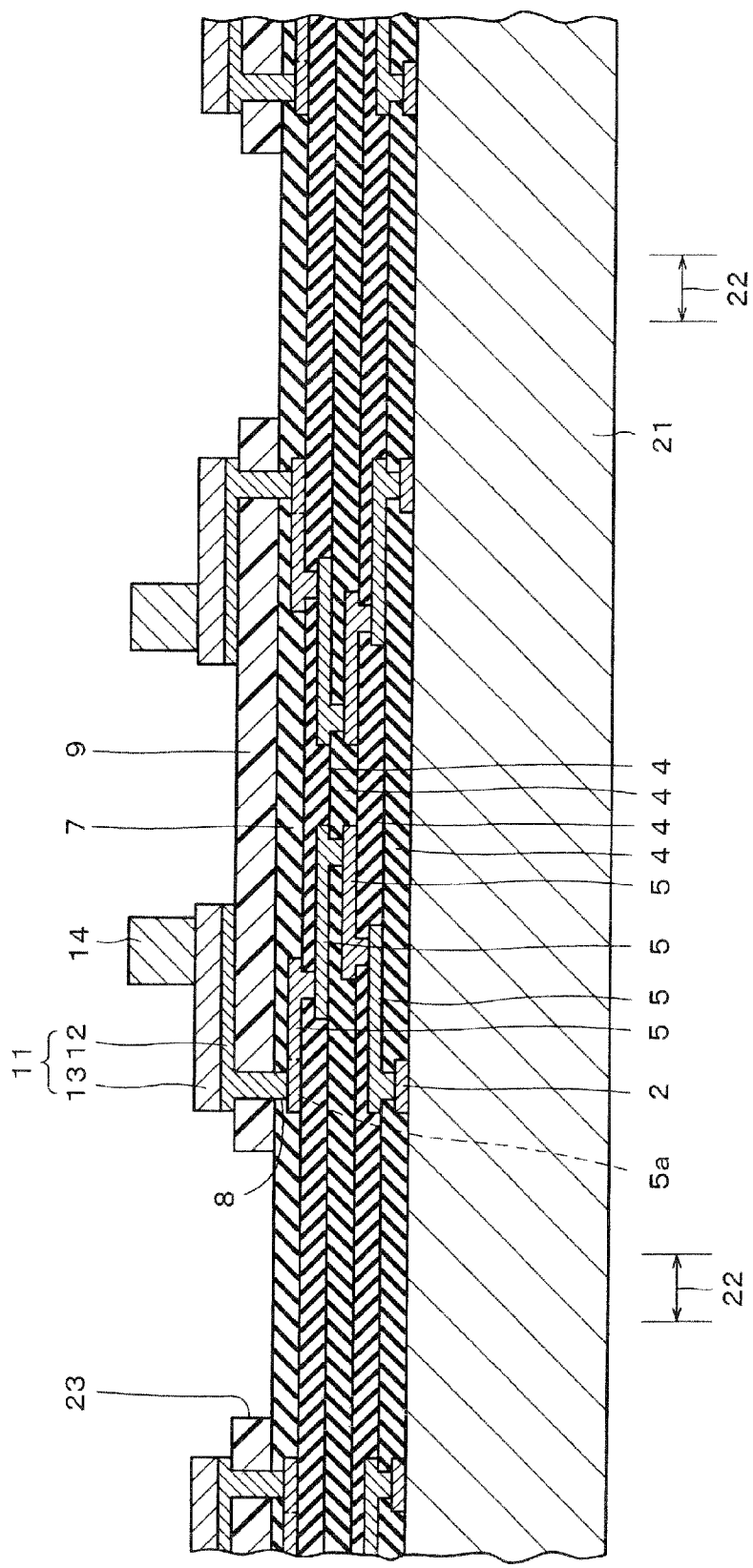
FIG. 2 is a cross-sectional view of an initially prepared structure in a first example of a manufacturing method of the semiconductor device shown in FIG. 1.

First, as shown in FIG. 2, a silicon substrate in a wafer state (referred to, hereinafter, as a semiconductor wafer 21) is prepared, on which the connection pads 2, the low-dielectric films 4 and the wirings 5 each of which consists of four layers, the passivation film 7, the upper-layer protective film 9, the upper-layer wirings 11 having the two-layered structure including the base metal layer 12 and the upper metal layer 13, and the columnar electrodes 14 are provided.

In this instance, the semiconductor wafer 21 is thicker to a certain extent than the silicon substrate 1 shown in FIG. 1. Materials such as those described above are given as the low-dielectric film 4. That is, materials, including porous materials, having a dielectric constant of 3.0 or less and a glass transition temperature of 400° C. or more are usable. In FIG. 2, areas indicated by reference number 22 correspond to dicing streets, and an opening 23 is formed in the upper-layer protective film 9 in an area including the dicing street 22 and both sides of the dicing street 22.

The opening 23 is, after the deposition of an organic resin such as polyimide or epoxy system resin over the entire top surface of the passivation film 7 by a spin-coating method, a screen-printing method, and the like, formed in the upper-layer protective film by photolithography or the like. From a planar view, the opening 23 is shaped into a frame surrounding each device area (each inner area of the dicing streets 22).

Figure 3:
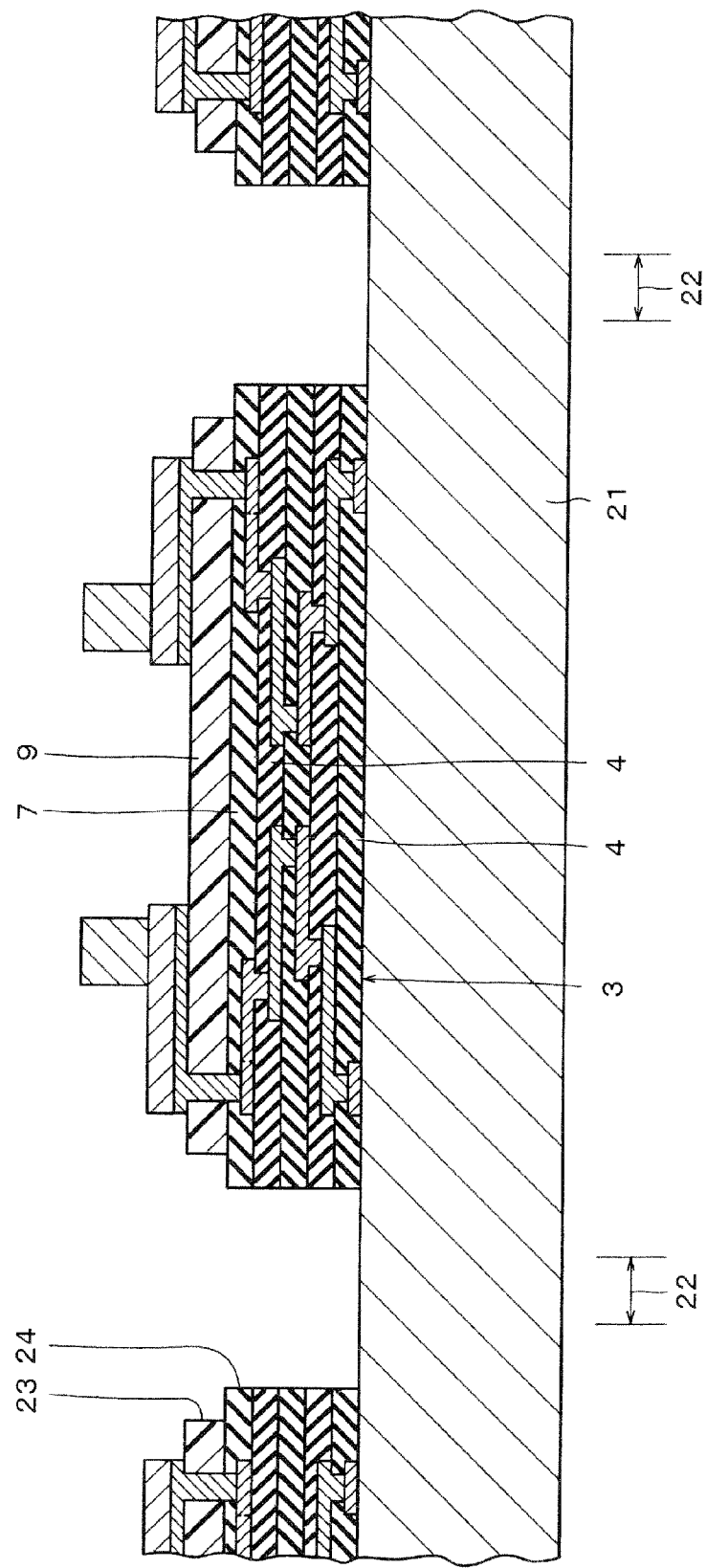
FIG. 3 is a cross-sectional view of a procedure subsequent to that in FIG. 2.

Next, as shown in FIG. 3, by laser processing in which laser beam irradiation is performed, a first groove 24 is formed in the passivation film 7 and the four layers of low-dielectric film 4 in the area including the dicing street 22 and both sides of the dicing street 22 within the opening 23 in the upper-layer protective film 95 The first groove 24 is formed having a width narrower than that of the opening 23 in the upper-layer protective film 9. As in the case of the opening 23 in the upper-layer protective film 9, from a planar view, the first groove 23 is shaped into a frame surrounding each device area, on the outer side of the side surfaces of the passivation film 7.

In this state, the low dielectric constant film and wiring laminated structure section 3 has been formed as a result of the four layers of low-dielectric film 4 and the passivation film 7 laminated on top of the semiconductor wafer 21 being separated by the first groove 24. The side surfaces of the passivation film 7 and the low dielectric constant film and wiring laminated structure section 3 are substantially flush. Here, because the low-dielectric film 4 is fragile, when the first groove 24 is formed by cutting through use of a blade, numerous chips and damage occur on the cut surfaces of the low-dielectric films 4. Therefore, a method of cutting the low-dielectric films 4 by laser beam irradiation is recommended to form the first groove 24.

In the above embodiment, a method has been described in which, in the state shown in FIG. 2 after the upper-layer protective film 9 has been formed over the entire top surface of the passivation film 7 and the opening 23 has been formed by the upper-layer protective film 9 being patterned, the low dielectric constant film and wiring laminated structure section 3 is irradiated with a laser beam, thereby forming the first groove 24. However, in this instance, a method is also conceivable in which, in a state where the upper-layer protective film 9 has been formed over the entire top surface of the passivation film 7 and the upper-layer protective film 9 has not been patterned, the first groove 24 in the upper-layer protective film 9, the passivation film 7, and the low dielectric constant film and wiring laminated structure section 3 is formed at once by laser beam irradiation.

However, in the case where the material of the upper-layer protective film 9 is a material such as polyimide system resin which easily absorbs laser energy and that is difficult to cut by laser beam irradiation, the above-described method is not preferable. In this instance, the opening 23 is preferably formed in advance in the upper-layer protective film 9 through use of photolithography.

Here, the first groove 24 may be formed before the wiring 11 and the columnar electrode 14 are formed. Also, the opening 23 in the upper-layer protective film 9 may have the same width as the first groove 24. In other words, the side surface of the upper-layer protective film 9 may substantially be flush with the side surfaces of the passivation film 7 and the low dielectric constant film and wiring laminated structure section 3.

Figure 4:
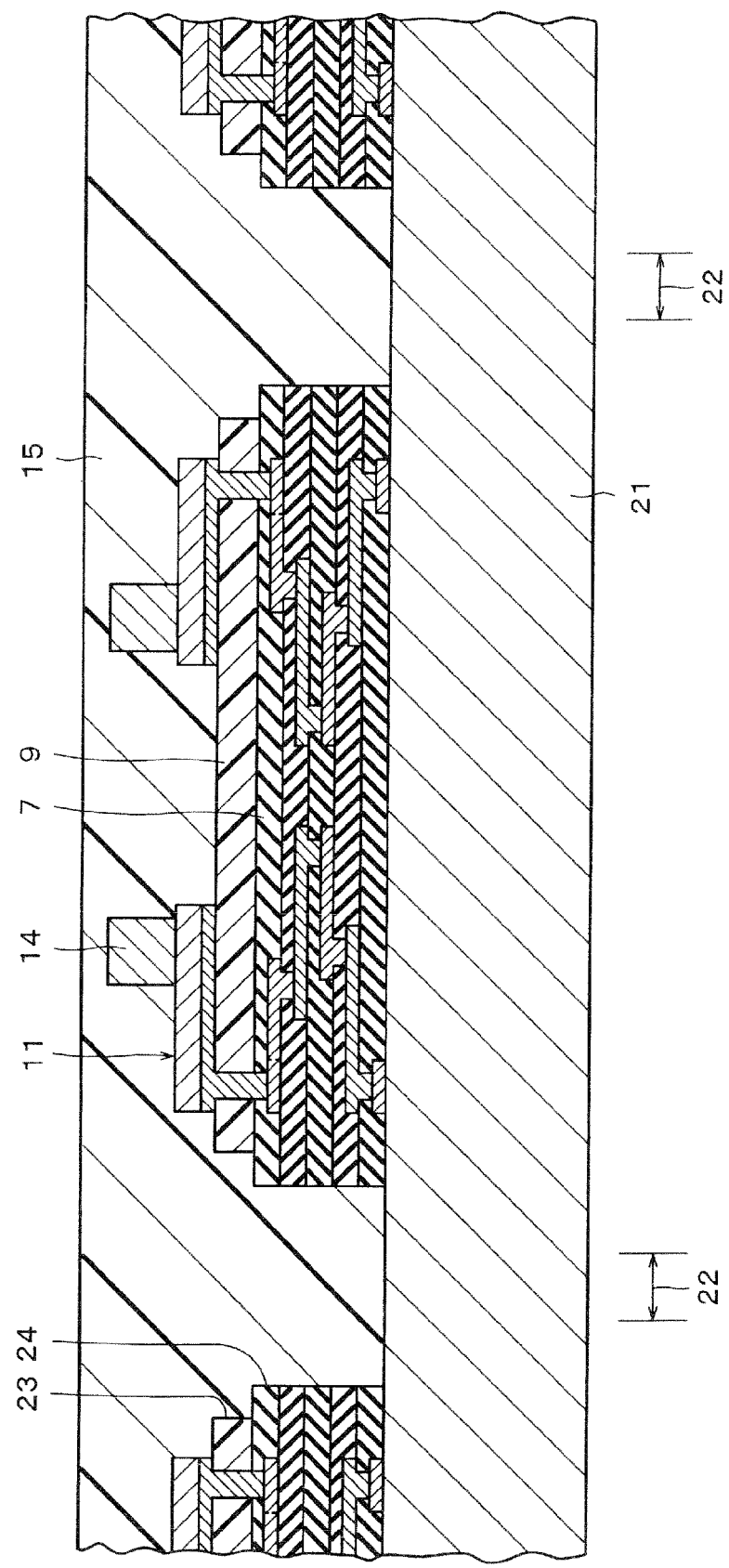
FIG. 4 is a cross-sectional view of a procedure subsequent to that in FIG. 3.

Next, as shown in FIG. 4, the sealing film 15 made of organic resin such as epoxy system resin is applied onto the top surface of the upper-layer protective film 9 including the upper-layer wiring 11 and the columnar electrode 14, the top surface of the passivation film 7 exposed via the opening 23 on the upper-layer protective film 9, and the top surface of the semiconductor wafer 21 exposed via the first groove 24, by the screen-printing method, the spin-coating method, or the like such that the thickness thereof is thicker than the height of the columnar electrode 14. The applied sealing film 15 is then hardened. Therefore, in this state, the top surface of the columnar electrode 14 is covered by the sealing film 15.

Figure 5:
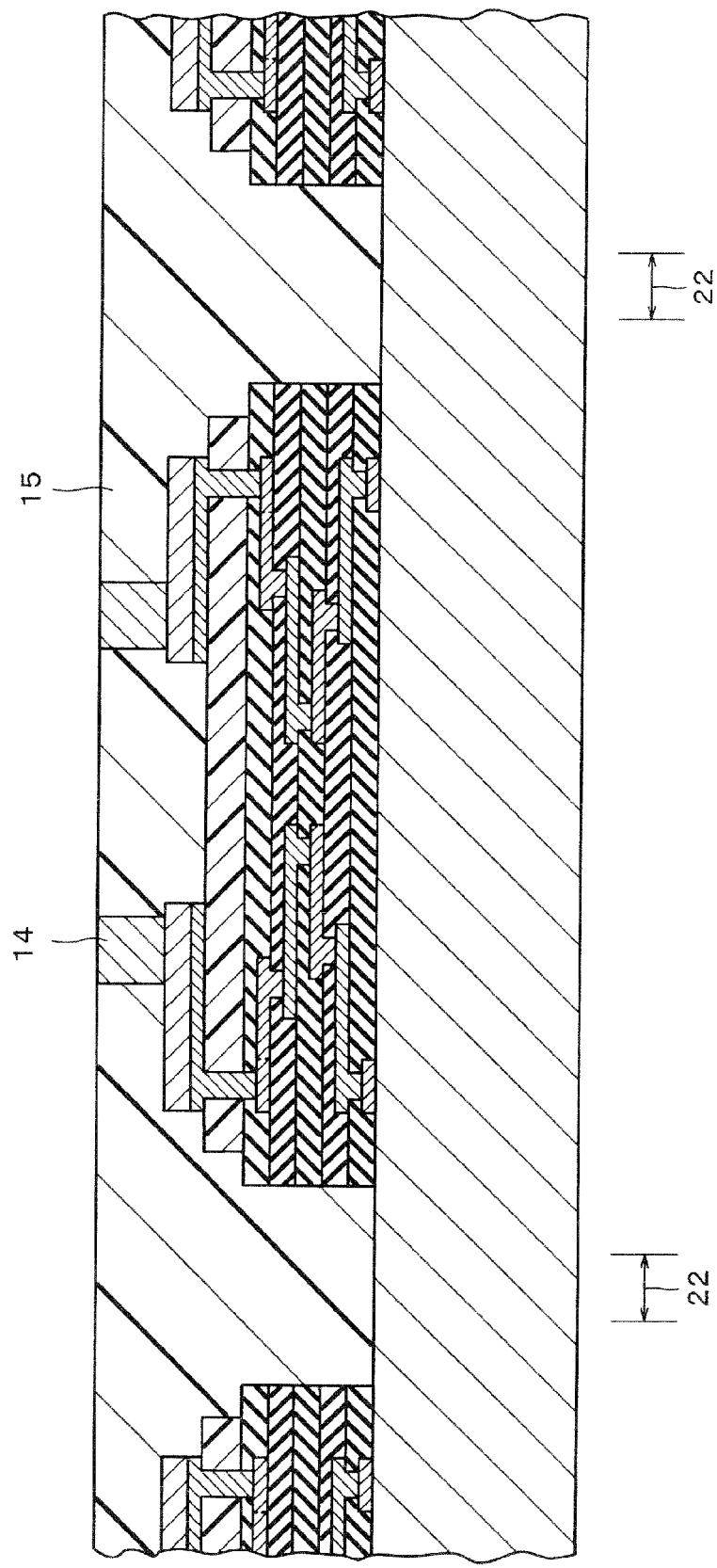
FIG. 5 is a cross-sectional view of a procedure subsequent to that in FIG. 4.
Figure 6:
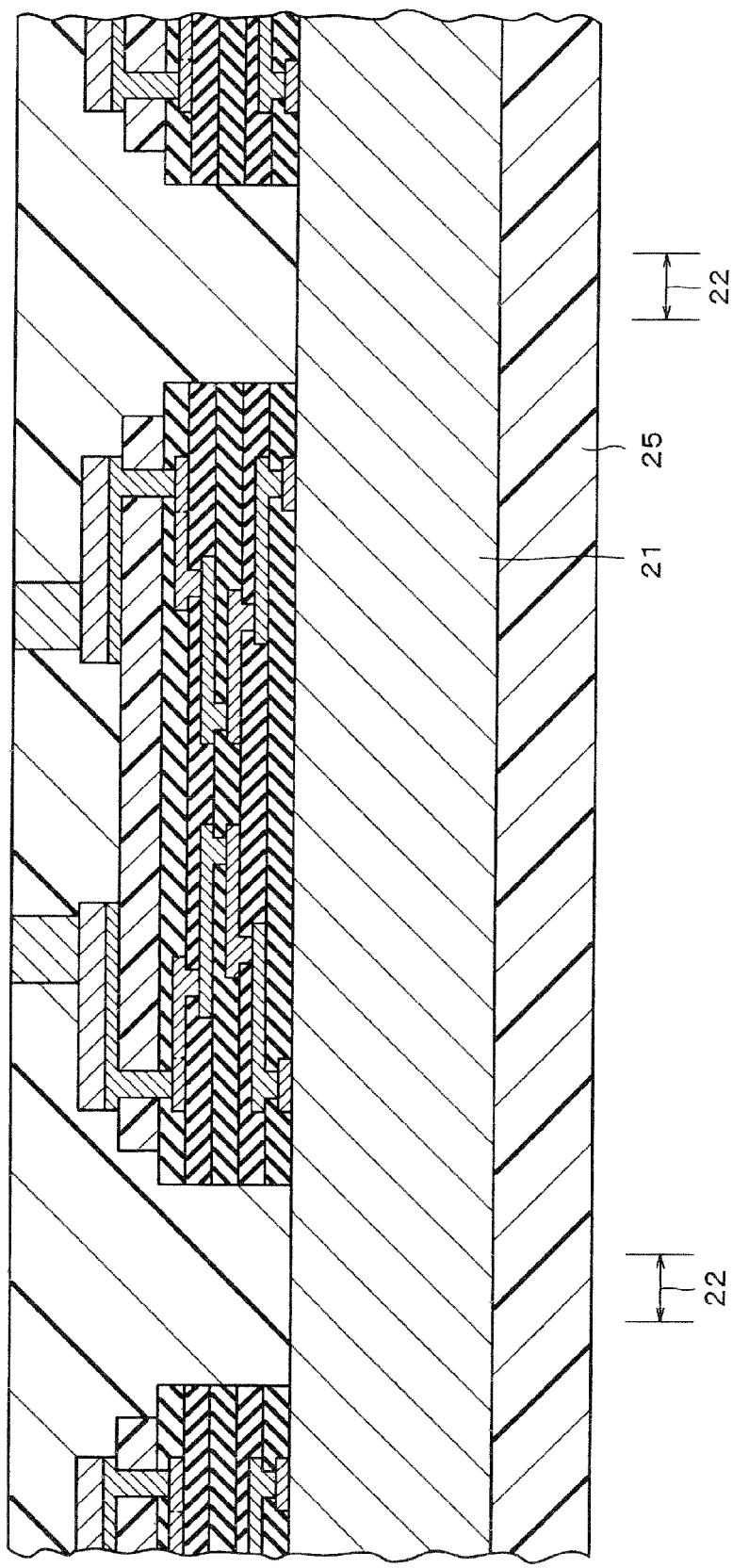
FIG. 6 is a cross-sectional view of a procedure subsequent to that in FIG. 5.

Next, the top surface side of the sealing film 15 is ground accordingly. As shown in FIG. 5, the top surface of the columnar electrode 14 is exposed, and the top surface of the sealing film 15 including the exposed top surface of the columnar electrode 14 is planarized. Then, as shown in FIG. 6, a dicing tape 25 is adhered to the bottom surface of the semiconductor wafer 21.

Figure 7:
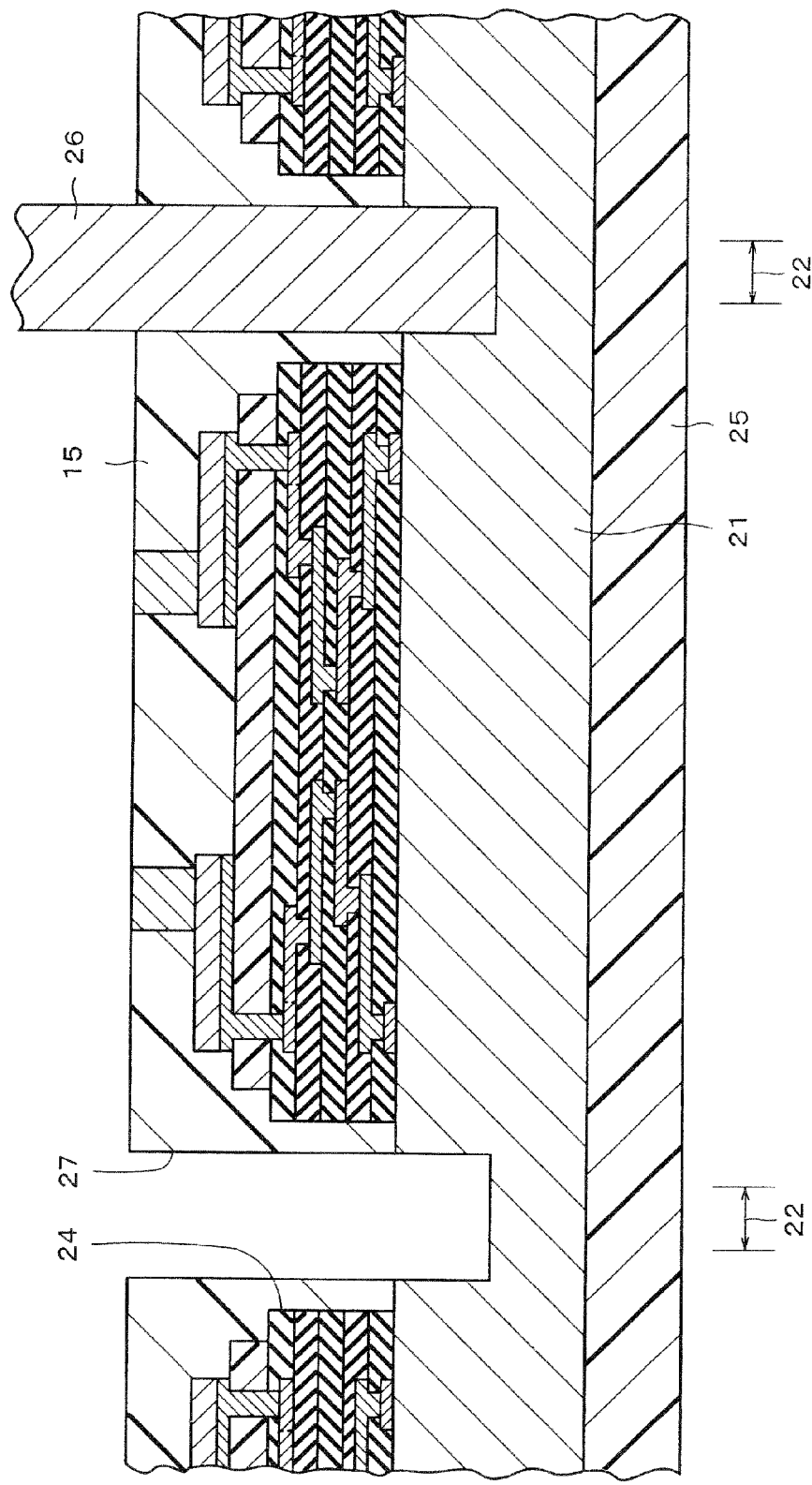
FIG. 7 is a cross-sectional view of a procedure subsequent to that in FIG. 6.

Next, as shown in FIG. 7, a blade 26 is prepared. This blade 26 is a disk-shaped grindstone, and the edge of the blade 26 has a cross-section of roughly squared U-shape. The thickness of the blade 26 is greater than the width of the dicing street 22 and less than the width of the first groove 24. The blade 26 is used for half-cutting from the top surface side of the sealing film 15 in the area including the dicing street 22 and both sides of the dicing street 22 to the middle of the semiconductor wafer 21, and thereby forming a straight-shaped second groove 27.

Here, the second groove 27 is formed in the sealing film 15 and on the top surface side of the semiconductor wafer 21 on the dicing street 22 and the areas on both sides of the dicing street 22 after the sealing film 15 made of organic resin such as epoxy system resin is formed by being applied and hardened. In other words, after the sealing film 15 is formed by being applied and hardened in a state where a groove that causes strength reduction has not been formed on the top surface side of the semiconductor wafer 21, the second groove 27 is formed on the top surface side of the semiconductor wafer 21. Therefore, the semiconductor wafer 21 is less likely to warp when the sealing film 15 made of thermosetting resin such as epoxy system resin is hardened. Moreover, in this instance, the dicing tape 25 is adhered to the bottom surface of the semiconductor wafer 21, and as a result the dicing tape 25 functions as a reinforcement tape. Therefore, the semiconductor wafer 21 is further less likely to warp.

Figure 8:
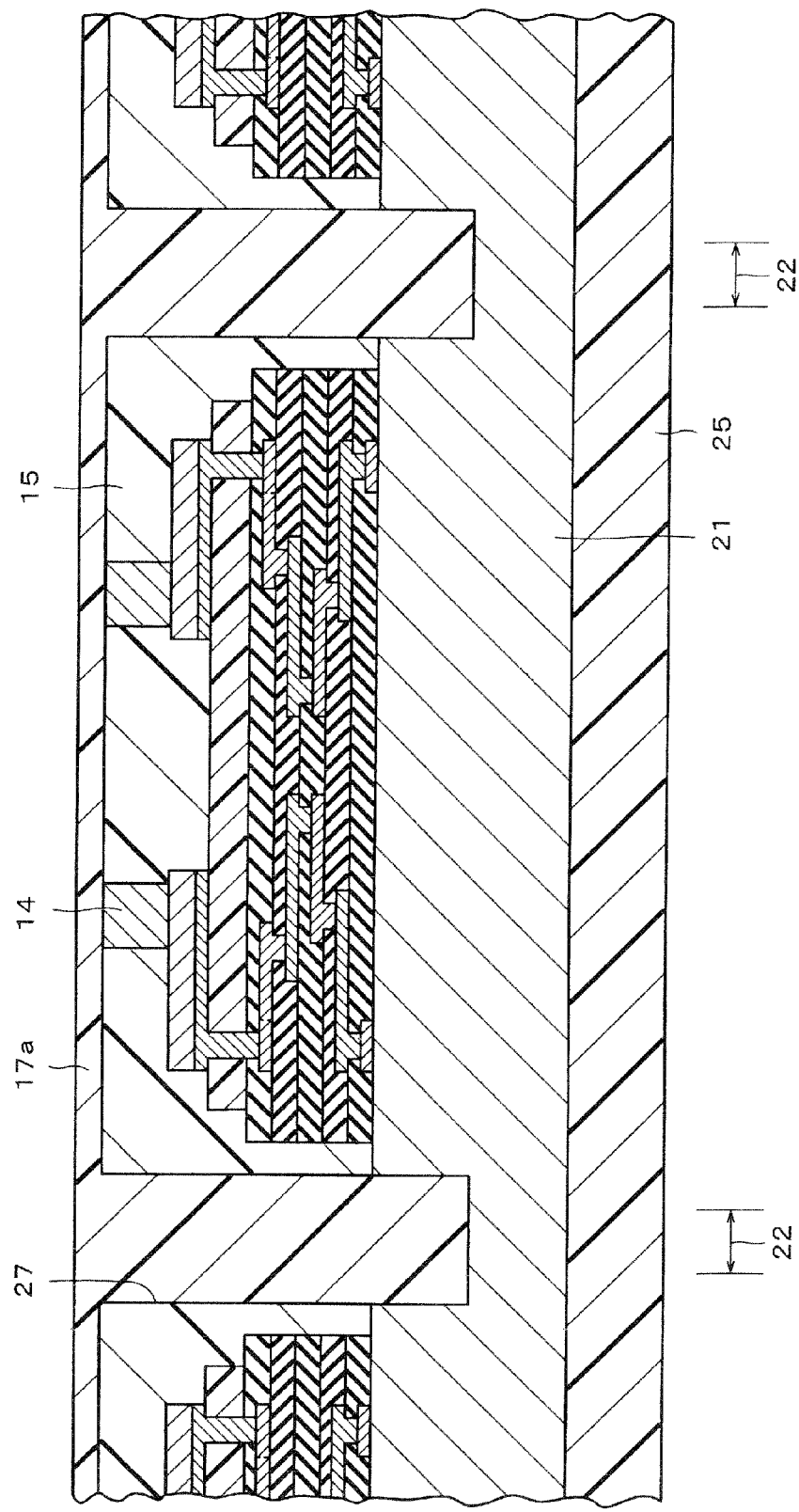
FIG. 8 is a cross-sectional view of a procedure subsequent to that in FIG. 7.

Next, as shown in FIG. 8, a side-section protective film formation film 17a made of organic resin such as epoxy system resin is applied into the second groove 27 and onto the top surface of the sealing film 15 including the columnar electrode 14 by the screen-printing method, the spin-coating method, or the like. The applied side-section protective film formation film 17a is then hardened. In this instance, because the sealing film 15 is already hardened and formed, the amount of side-section protective film formation film 17a to be applied is reduced. Consequently, the semiconductor wafer 21 is less likely to warp when the side-section protective film formation film 17a is hardened. Moreover, in this instance, the dicing tape 25 is adhered to the bottom surface of the semiconductor wafer 21, and as a result the dicing tape 25 functions as a reinforcement tape. Therefore, the semiconductor wafer 21 is further less likely to warp.

Figure 9:
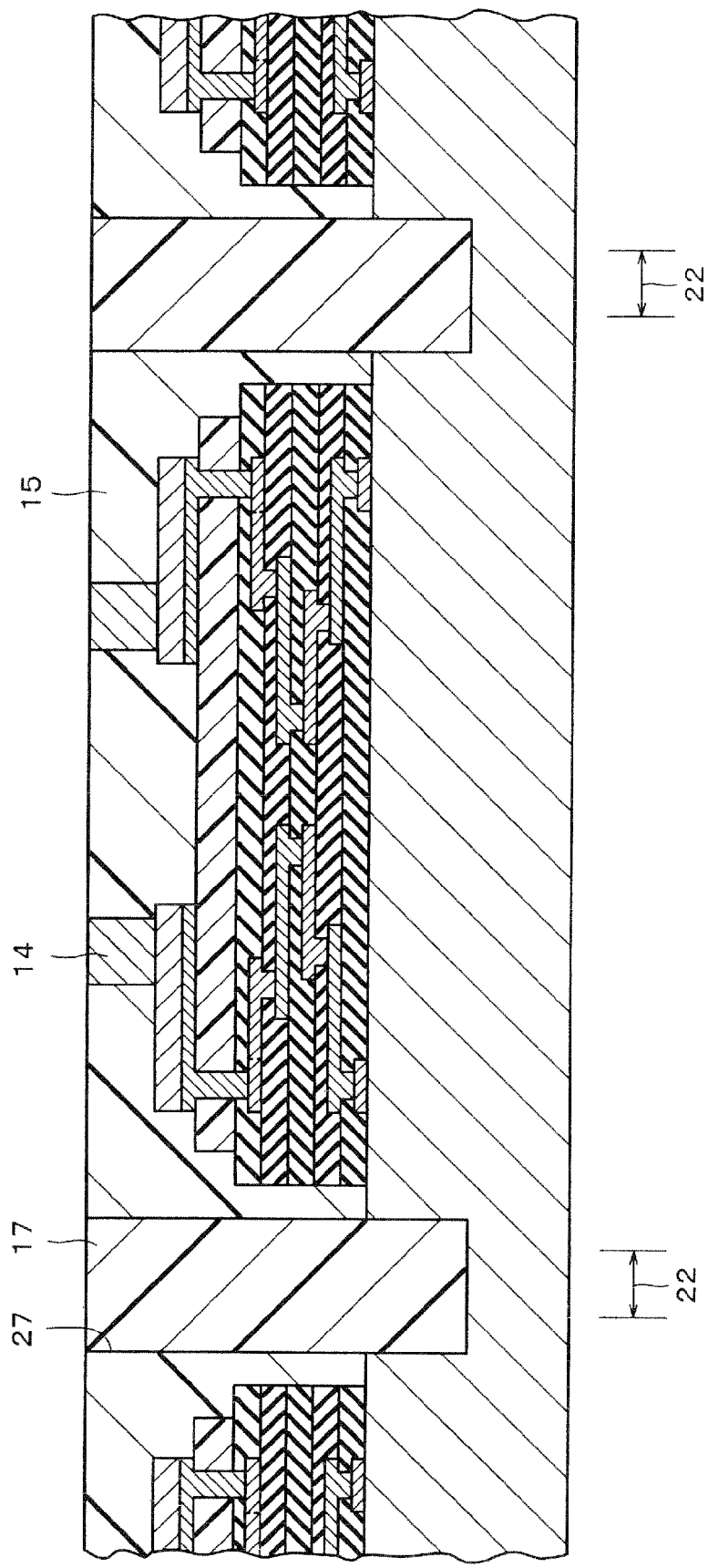
FIG. 9 is a cross-sectional view of a procedure subsequent to that in FIG. 8.

Next, the dicing tape 25 is peeled. Then, the top surface side of the side-section protective film formation film 17a is ground accordingly, and as shown in FIG. 9, the top surfaces of the columnar electrode 14 and the sealing film 15 are exposed. In this state, the side-section protective film 17 is formed only within the second groove 27, and the top surfaces of the columnar electrode 14 and the sealing film 15 including the top surface of the side-section protective film 17 are planarized.

Figure 10:
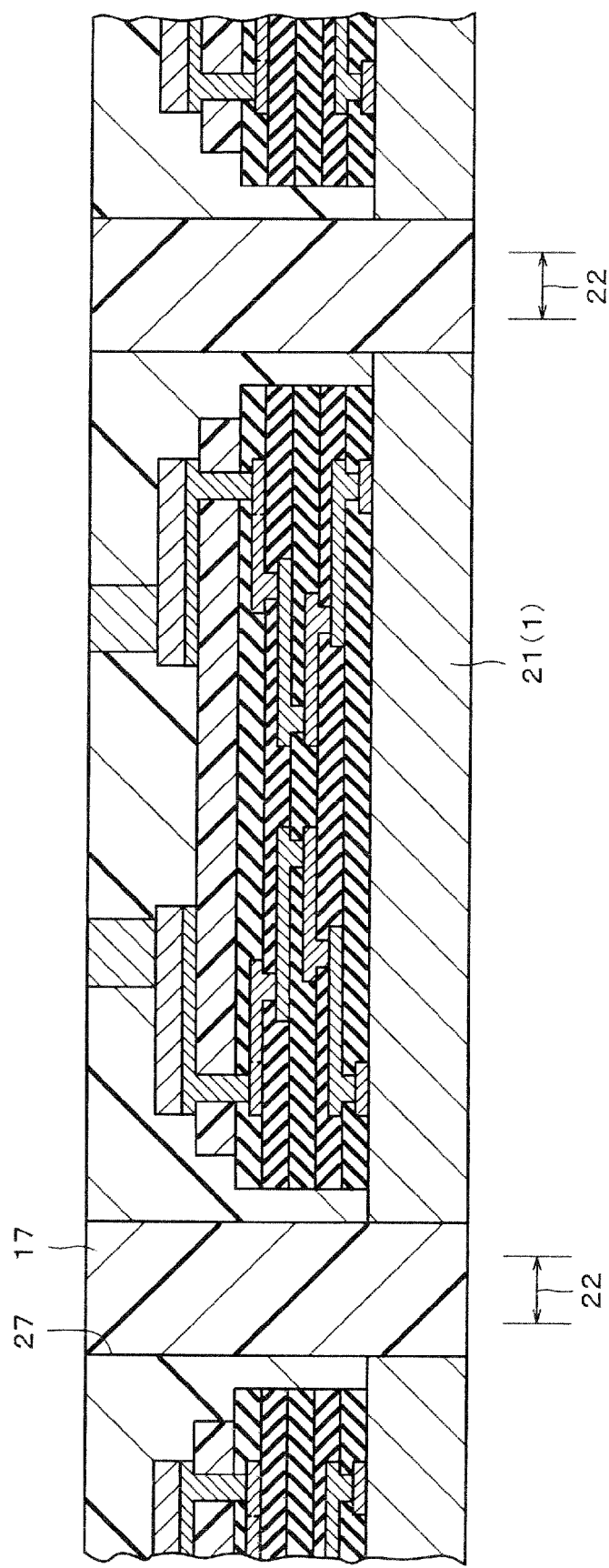
FIG. 10 is a cross-sectional view of a procedure subsequent to that in FIG. 9.

Next, when the bottom surface side of the semiconductor wafer 21 is ground using a grindstone (not shown) until at least the side-section protective film 17 formed within the second groove 27 is exposed, the thickness of the semiconductor wafer 21 decreases and the semiconductor wafer 21 is separated into individual silicon substrates 1 as shown in FIG. 10. In this state, the bottom surfaces of the silicon substrate 1 and the side-section protective film 17 formed within the second groove 27 are flush with each other.

Figure 11:
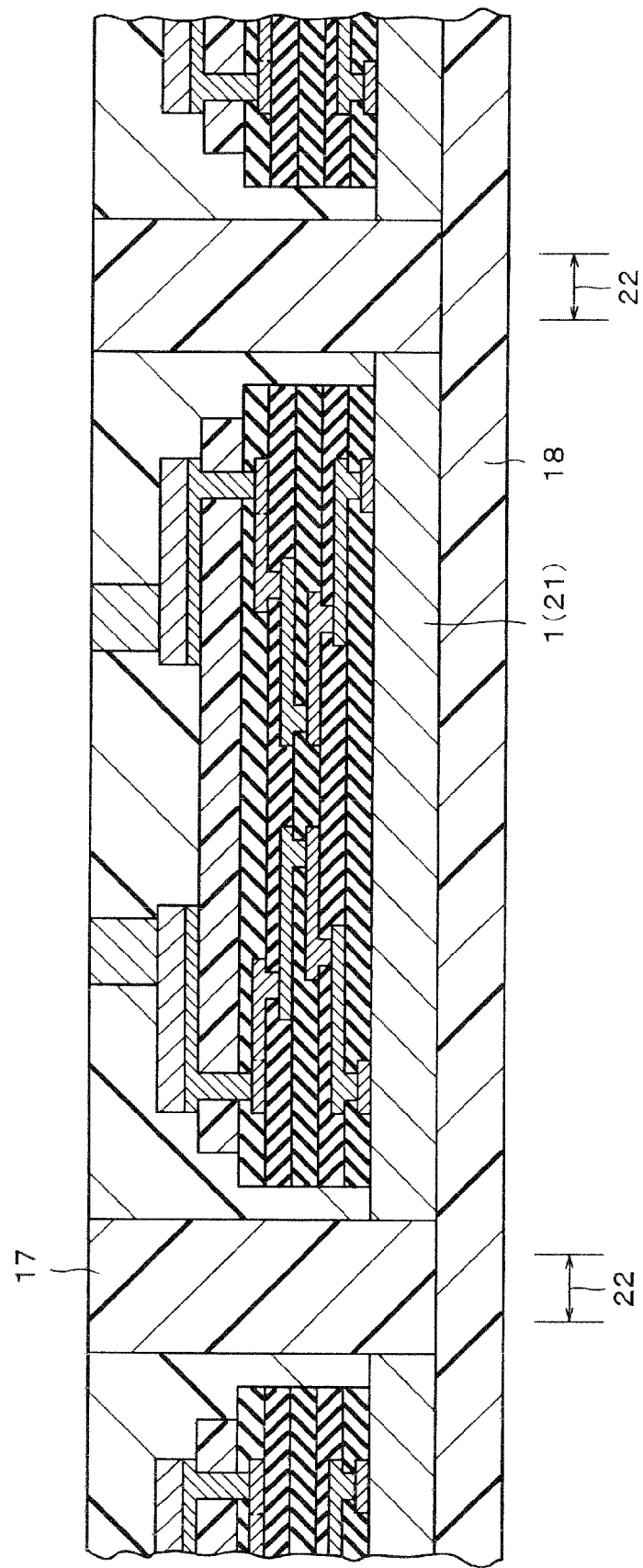
FIG. 11 is a cross-sectional view of a procedure subsequent to that in FIG. 10.

Next, as shown in FIG. 11, the lower-layer protective film 18 made of organic resin such as epoxy system resin is formed on the bottom surfaces of the silicon substrate 1 (semiconductor wafer 21) and the side-section protective film 17. To form the lower-layer protective film 18, a resin sheet may be adhered. Alternatively, liquid resin may be applied by the screen-printing method, the spin-coating method, or the like.

Figure 12:
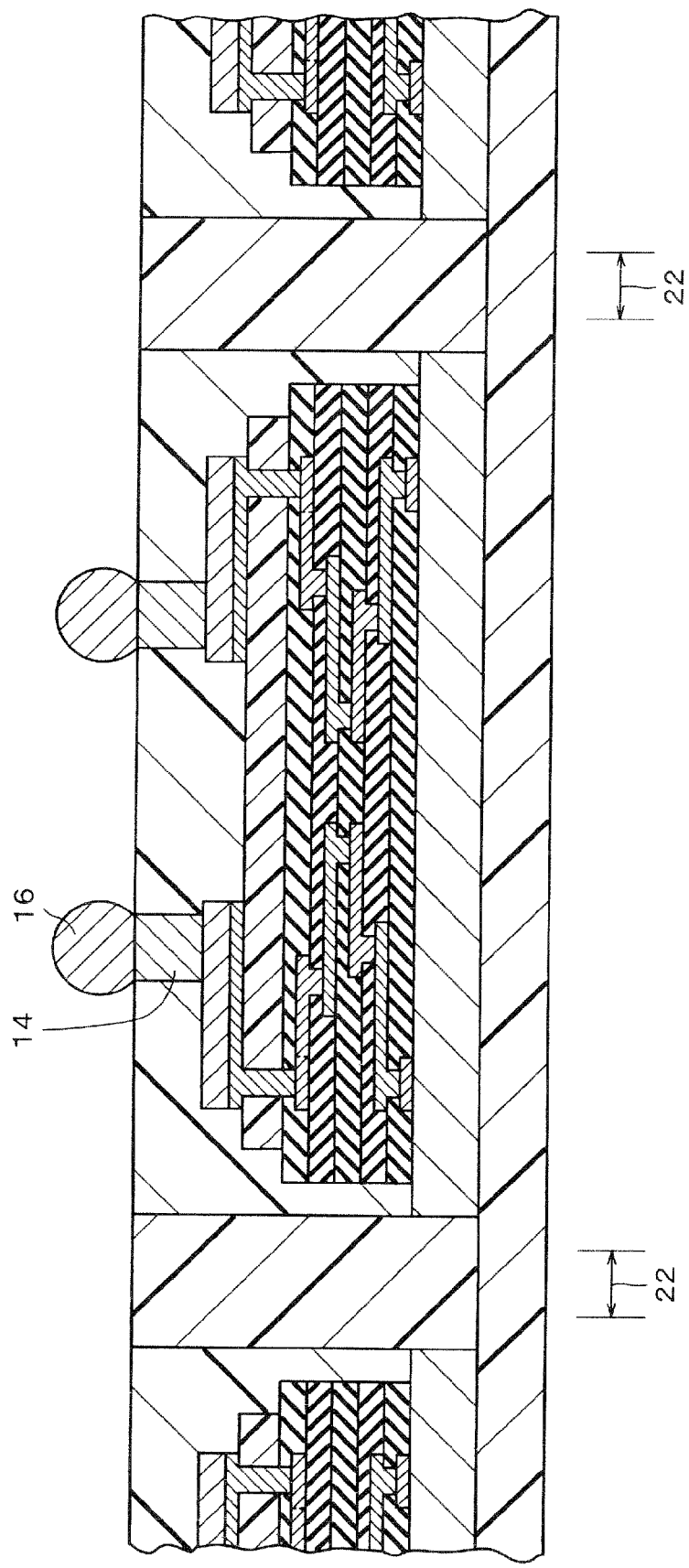
FIG. 12 is a cross-sectional view of a procedure subsequent to that in FIG. 11.
Figure 13:
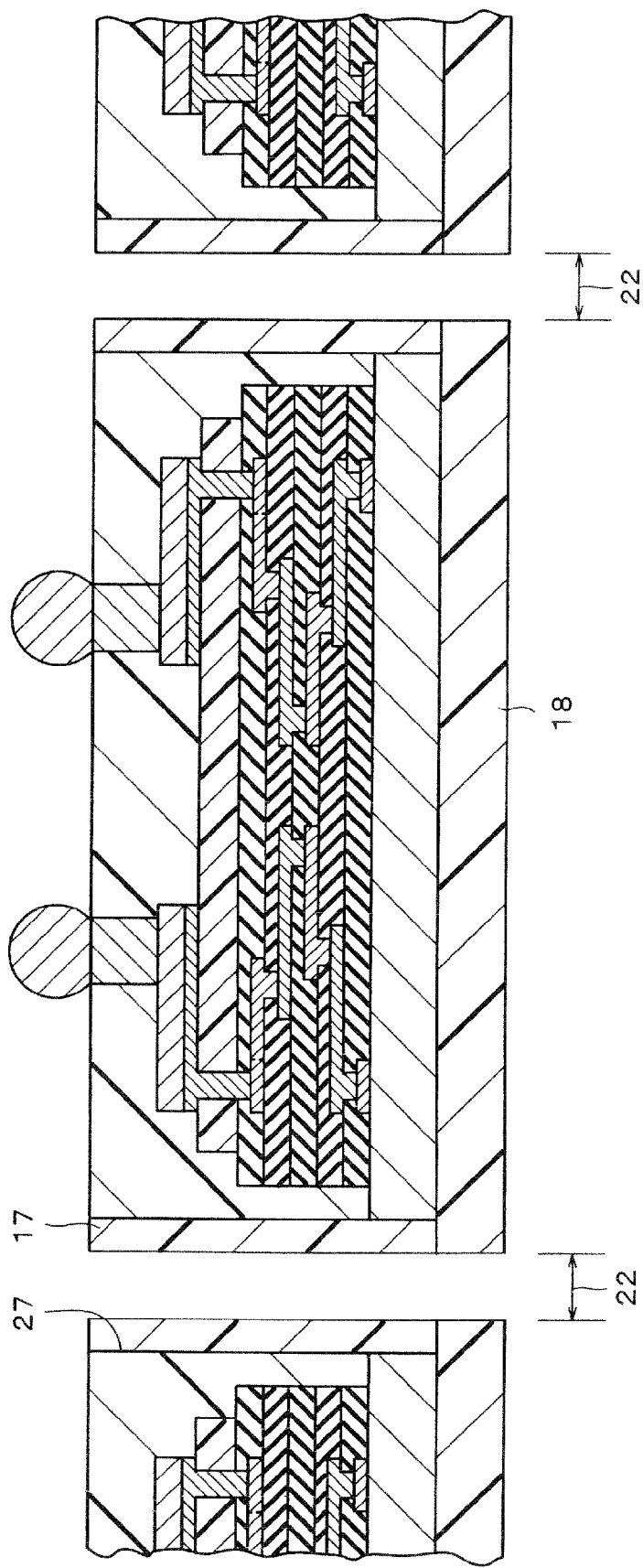
FIG. 13 is a cross-sectional view of a procedure subsequent to that in FIG. 12.

Next, as shown in FIG. 12, the solder ball 16 is formed on the top surface of the columnar electrode 14. Then, as shown in FIG. 13, when the side-section protective film 17 and the lower-layer protective film 18 are cut along the dicing street 22 in the center of the second groove 27, a plurality of semiconductor devices shown in FIG. 1 is obtained.

In the semiconductor device obtained as described above, the sealing film 15 is provided to cover the upper-layer wiring 11, and ensure humidity-tolerant reliability and physical protection. On the other hand, since the side-section protective film 17 does not cover the upper-layer wiring 11, as long as physical protection is ensured, humidity-tolerant reliability of the protective film 17 may be less reliable to a certain extent. As stated above, the sealing film 15 and the side-section protective film 17 serve for slightly different purposes. Therefore, although the sealing film 15 and the side-section protective film 17 may be made of the same material, materials appropriate for each may also be used.

In other words, humidity-tolerant reliability is required for the sealing film 15, but is not essential for the side-section protective film 17. Therefore, elasticity of the side-section protective film 17 (for example, 5 GPa to 15 GPa) may be lower than the elasticity of the sealing film 15 (for example, 16 GPa to 25 GPa). In addition, to reduce warping in the semiconductor wafer 21 by low-temperature hardening, the glass transition temperature of the side-section protective film 17 (for example, 50° C. to 80° C.) may be lower than the glass transition temperature of the sealing film 15 (for example, 100° C. to 150° C.).

SECOND EXAMPLE OF THE
MANUFACTURING METHOD

Next, a second example of the manufacturing method of the semiconductor device shown in FIG. 1 will be described.

Figure 14:
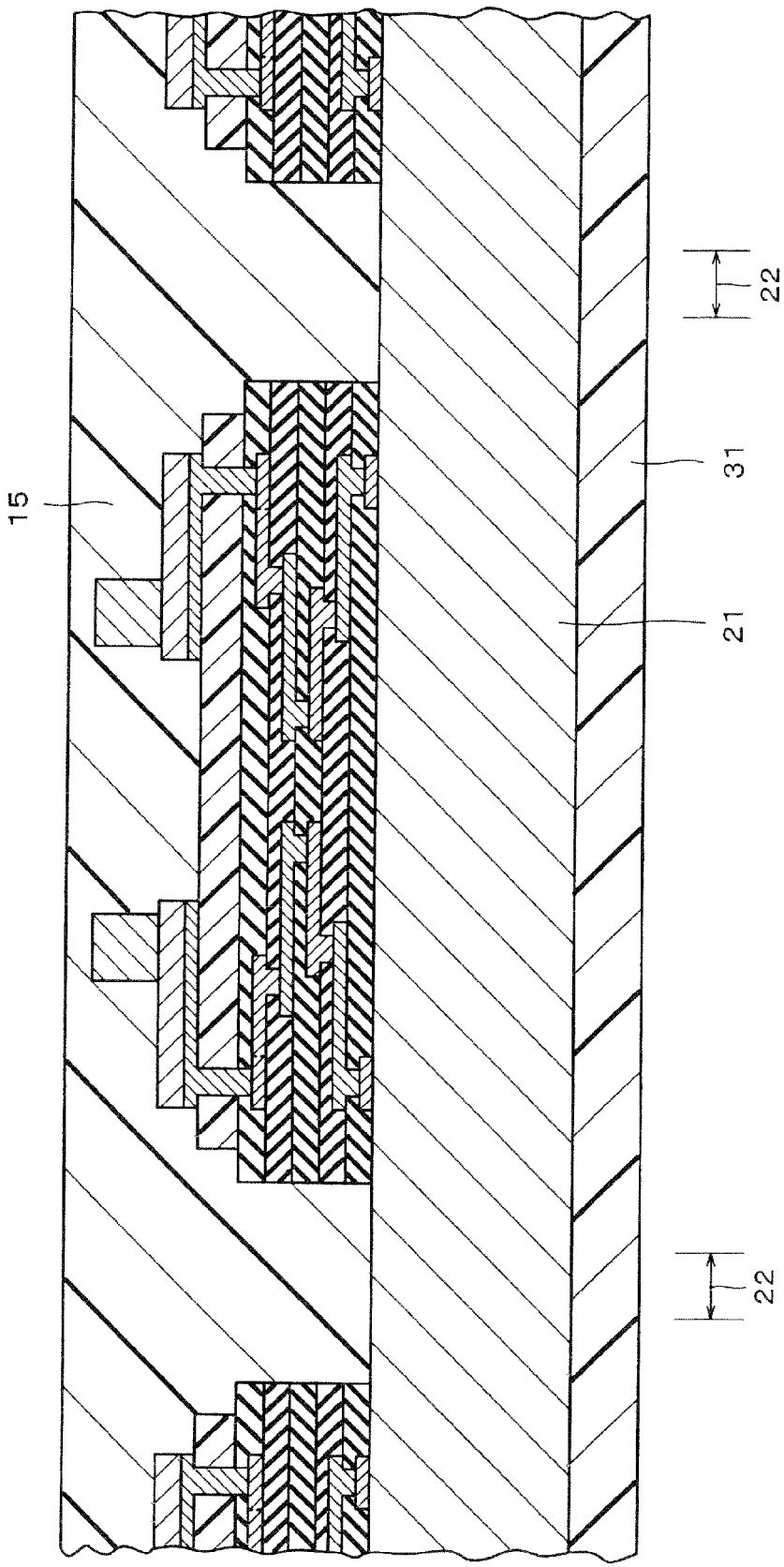
FIG. 14 is a cross-sectional view of a predetermined procedure in a second example of the manufacturing method of the semiconductor device shown in FIG. 1.

In this instance, after the procedure shown in FIG. 4, as shown in FIG. 14, a reinforcement film 31 is formed on the bottom surface of the semiconductor wafer 21 by a resin sheet made of organic resin such as epoxy system resin being adhered. Alternatively, the reinforcement film 31 may be formed by liquid resin being applied by the screen-printing method, the spin-coating method, or the like.

Figure 15:
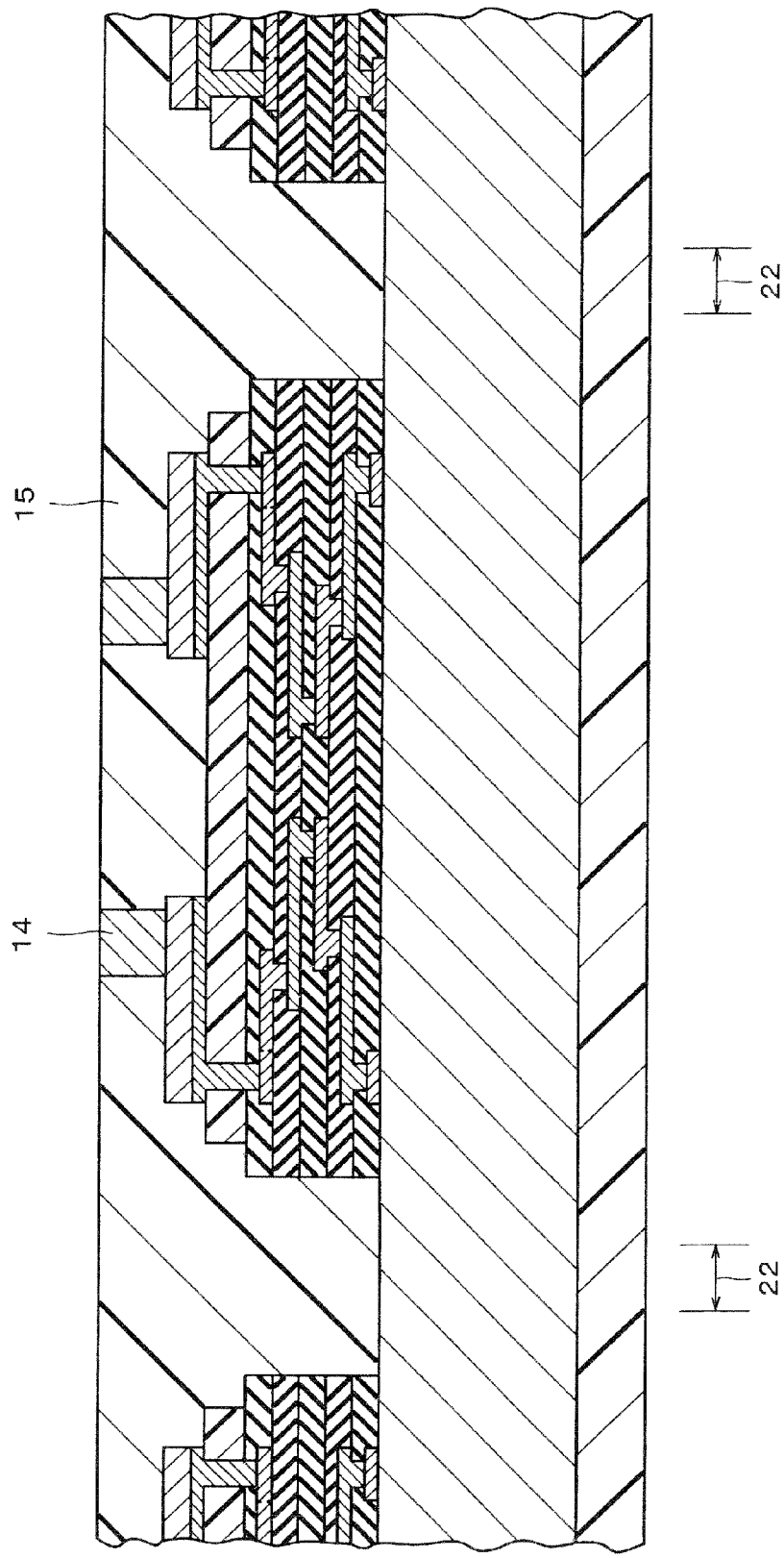
FIG. 15 is a cross-sectional view of a procedure subsequent to that in FIG. 14.
Figure 16:
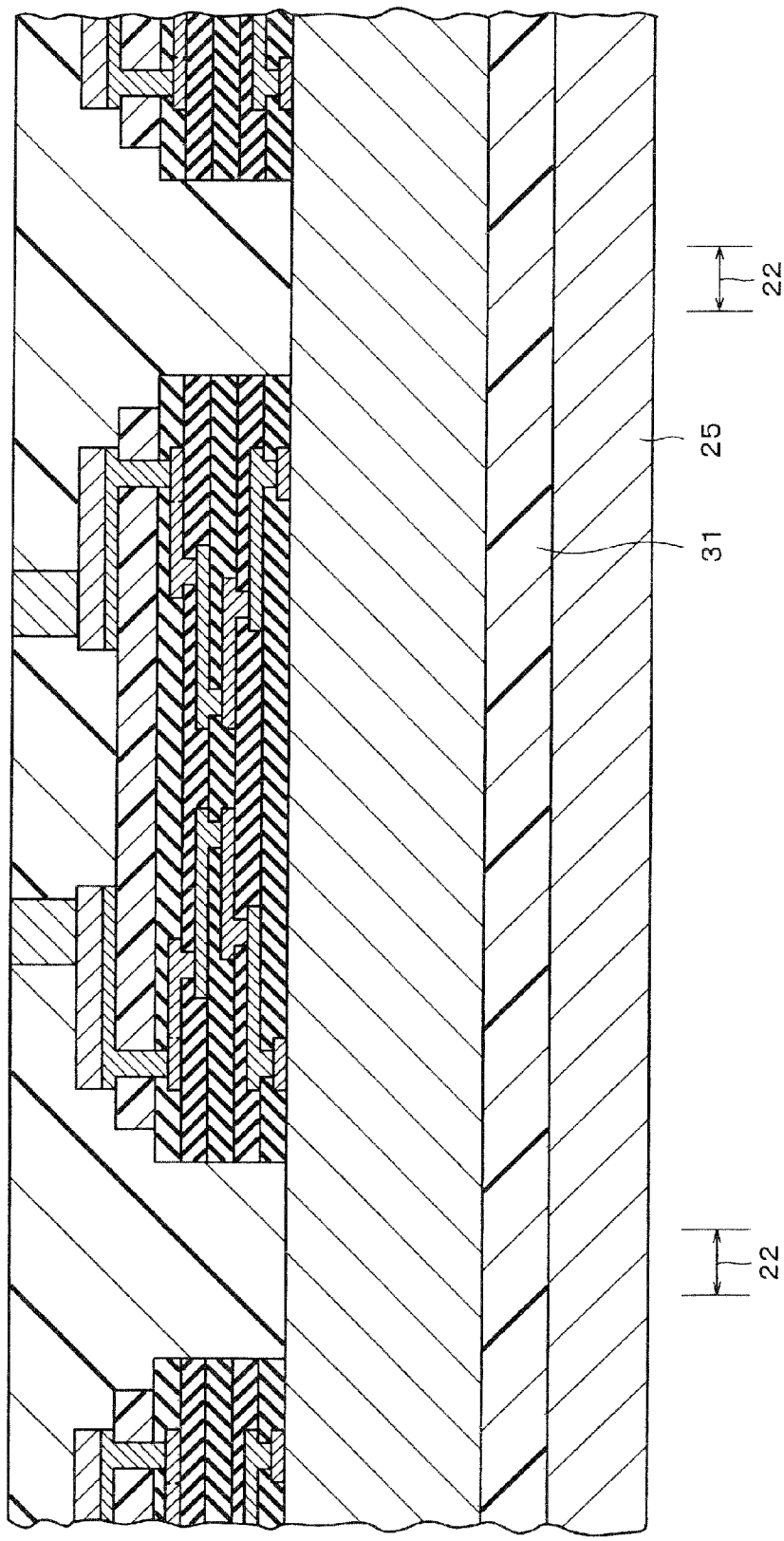
FIG. 16 is a cross-sectional view of a procedure subsequent to that in FIG. 15.
Figure 17:
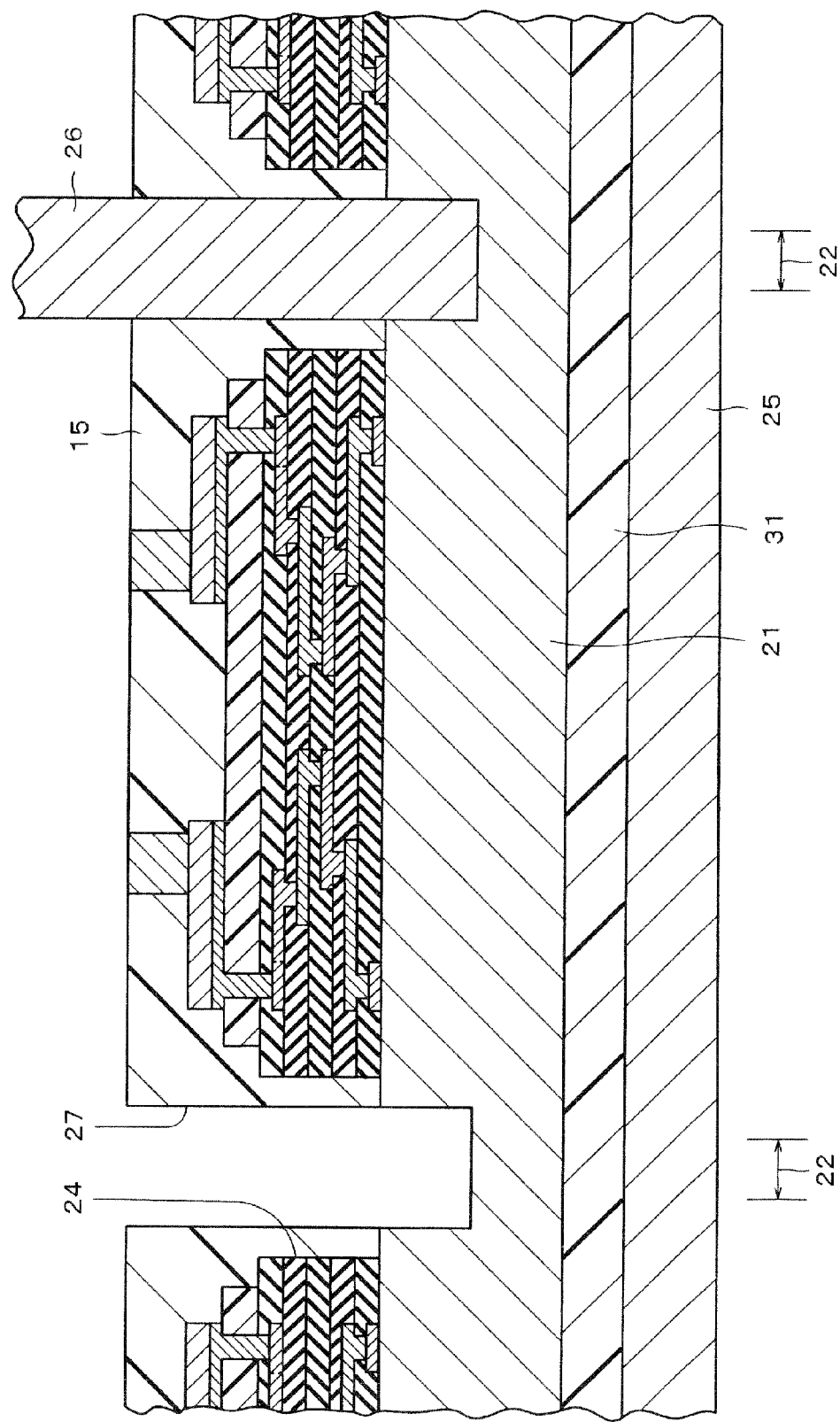
FIG. 17 is a cross-sectional view of a procedure subsequent to that in FIG. 16.

Next, the top surface side of the sealing film is ground accordingly. As shown in FIG. 15, the top surface of the columnar electrode 14 is exposed, and the top surface of the sealing film 15 including the exposed top surface of the columnar electrode 14 is planarized. Then, as shown in FIG. 16, the dicing tape 25 is adhered to the bottom surface of the reinforcement film 31. Next, as shown in FIG. 17, the blade 26 is used for half-cutting from the top surface side of the sealing film 15 in the area including the dicing street 22 and both sides of the dicing street 22 to the middle of the semiconductor wafer 21, and thereby forming a straight-shaped second groove 27.

In this instance as well, the second groove 27 is formed in the sealing film 15 and on the top surface side of the semiconductor wafer 21 on the dicing street 22 and the areas on both sides of the dicing street 22 after the sealing film 15 made of organic resin such as epoxy system resin is formed by being applied and hardened. In other words, after the sealing film 15 is formed by being applied and hardened in a state where a groove that causes strength reduction has not been formed on the top surface side of the semiconductor wafer 21, the second groove 27 is formed on the top surface side of the semiconductor wafer 21. Therefore, the semiconductor wafer 21 is less likely to warp when the sealing film 15 made of thermosetting resin such as epoxy system resin is hardened. Moreover, in this instance, the reinforcement film 31 and the dicing tape (reinforcement tape) 25 are provided on the bottom surface of the semiconductor wafer 21. Therefore, the semiconductor wafer 21 is further less likely to warp.

Figure 18:
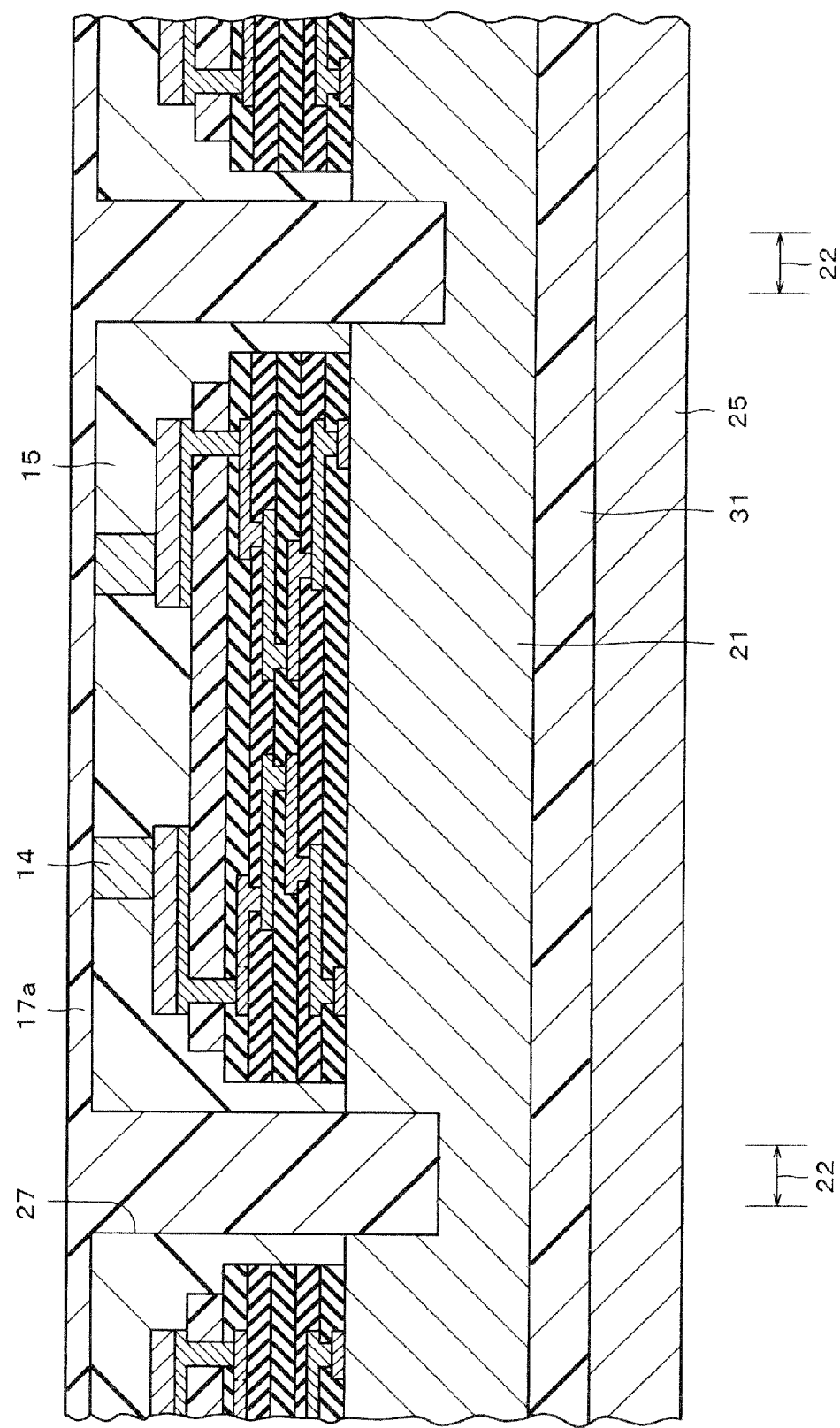
FIG. 18 is a cross-sectional view of a procedure subsequent to that in FIG. 17.

Next, as shown in FIG. 18, the side-section protective film formation film 17a made of organic resin such as epoxy system resin is applied into the second groove 27 and onto the top surface of the sealing film 15 including the columnar electrode 14 by the screen-printing method, the spin-coating method, or the like. The applied side-section protective film formation film 17a is then hardened. In this instance as well, because the sealing film 15 is already hardened and formed, the amount of side-section protective film formation film 17a to be applied is reduced. Consequently, the semiconductor wafer 21 is less likely to warp when the side-section protective film formation film 17a is hardened. Moreover, in this instance, the reinforcement film 31 and the dicing tape (reinforcement tape) 25 are provided on the bottom surface of the semiconductor wafer 21. Therefore, the semiconductor wafer 21 is further likely to warp.

Figure 19:
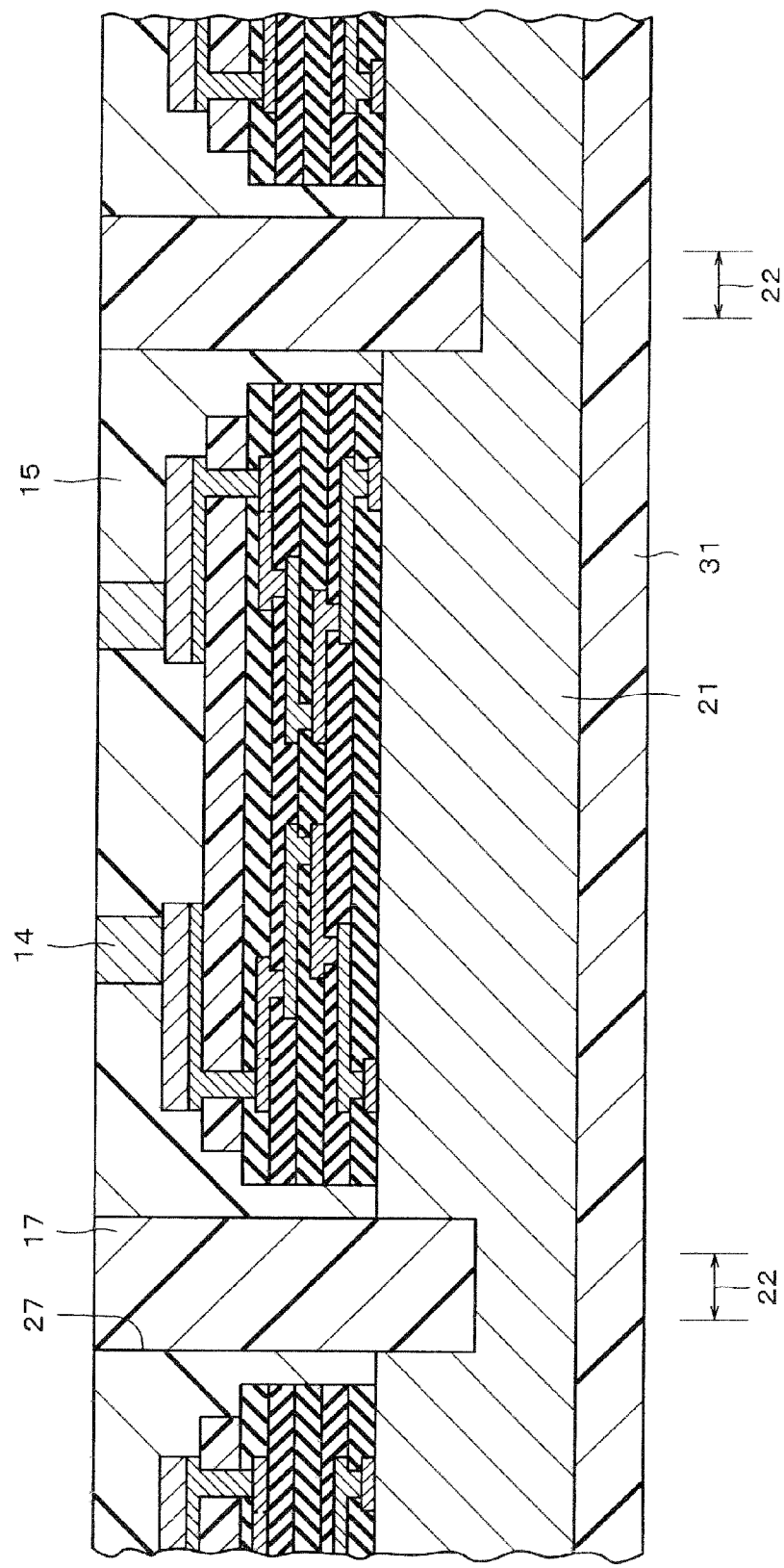
FIG. 19 is a cross-sectional view of a procedure subsequent to that in FIG. 18.

Next, the dicing tape 25 is peeled. Then, the top surface side of the side-section protective film formation film 17a is ground accordingly, and as shown in FIG. 19, the top surfaces of the columnar electrode 14 and the sealing film 15 are exposed. In this state, the side-section protective film 17 is formed only within the second groove 27, and the top surfaces of the columnar electrode 14 and the sealing film 15 including the top surface of the side-section protective film 17 are planarized.

Next, when the entire reinforcement film 31 and the bottom surface side of the semiconductor wafer 21 are ground using a grindstone (not shown) until at least the side-section protective film 17 formed within the second groove 27 is exposed, the thickness of the semiconductor wafer 21 decreases and the semiconductor wafer 21 is separated into individual silicon substrates 1 as shown in FIG. 10. In this state, the bottom surfaces of the silicon substrate 1 and the side-section protective film 17 formed within the second groove 27 are flush with each other. After the above described procedures, by performing procedures similar to those in the first example of the manufacturing method, a plurality of semiconductor devices shown in FIG. 1 is obtained.

THIRD EXAMPLE OF THE MANUFACTURING METHOD

Next, a third example of the manufacturing method of the semiconductor device shown in FIG. 1 will be described.

Figure 20:
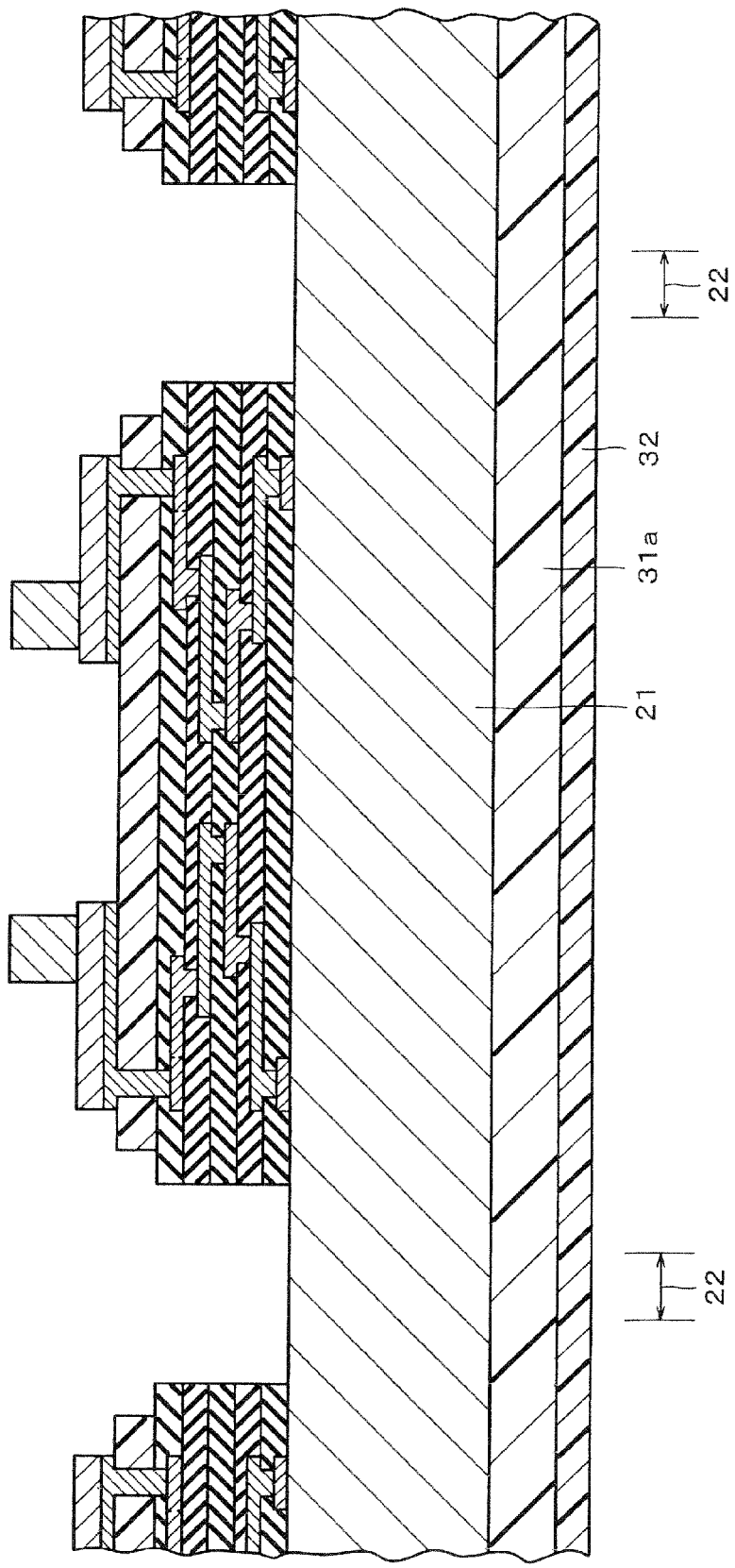
FIG. 20 is a cross-sectional view of a predetermined procedure in a third example of the manufacturing method of the semiconductor device shown in FIG. 1.

In this instance, after the procedure shown in FIG. 3, as shown in FIG. 20, an unhardened resin sheet made of organic resin such as epoxy system resin provided on the top surface of a release tape 32 is adhered to the bottom surface of the semiconductor wafer 21, thereby forming an unhardened-resin reinforcement film formation film 31a.

Figure 21:
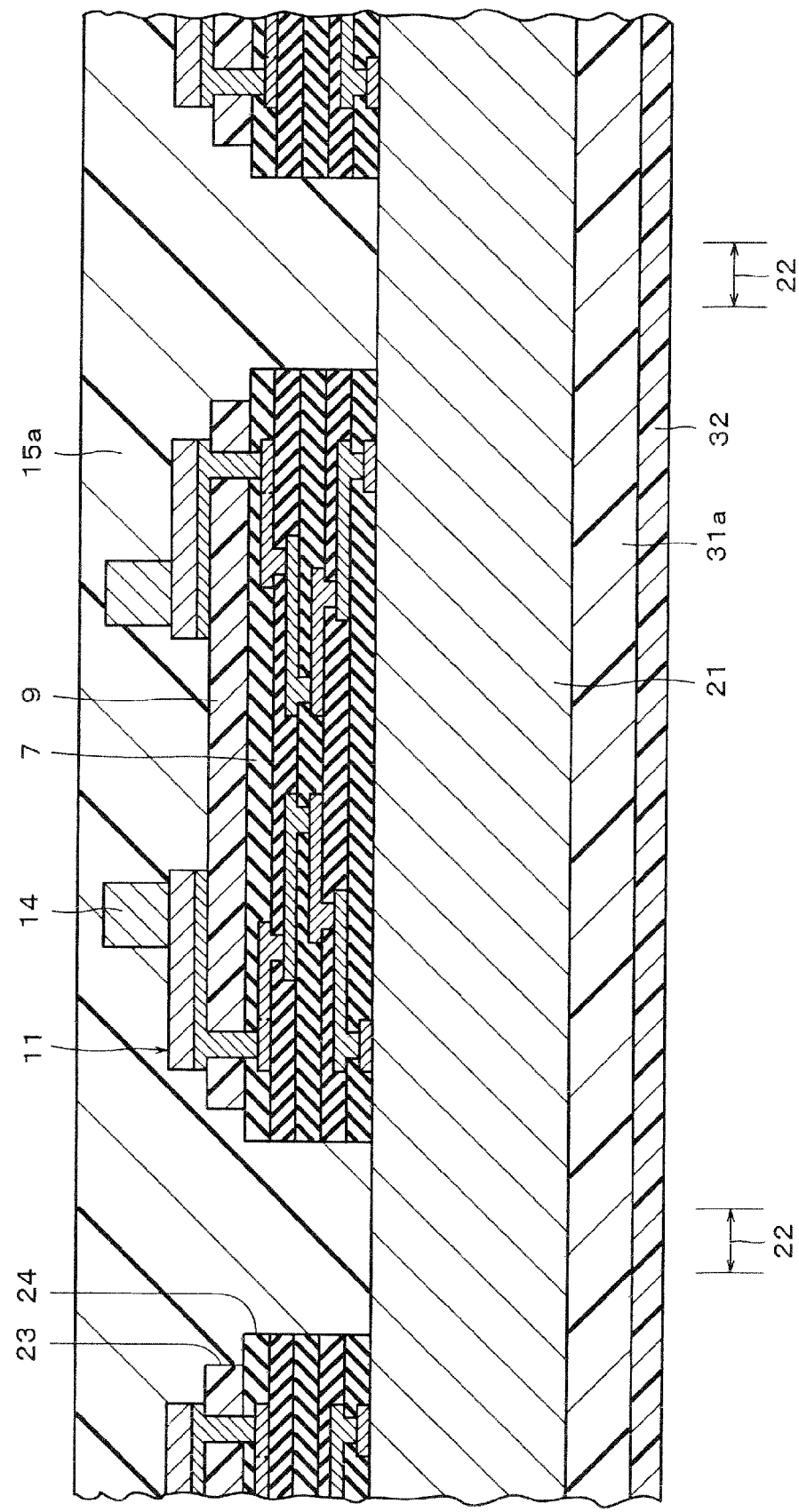
FIG. 21 is a cross-sectional view of a procedure subsequent to that in FIG. 20.

Next, as shown in FIG. 21, an unhardened-resin sealing film formation film 15a made of organic resin such as epoxy system resin is formed by being applied to the top surface of the upper-layer protective film 9 including the upper-layer wiring 11 and the columnar electrode 14, the top surface of the passivation film 7 exposed via the opening 23 on the upper-layer protective film 9, and the top surface of the semiconductor wafer 21 exposed via the first groove 24, by the screen-printing method, the spin-coating method, or the like such that the thickness thereof is thicker than the height of the columnar electrode 14. The unhardened-resin sealing film formation film 15a is applied such as to be thicker than the height of the columnar electrode 14. Therefore, in this state, the top surface of the columnar electrode 14 is covered by the unhardened-resin sealing film formation film 15a.

Next, the release tape 32 is peeled. Next, when the unhardened-resin sealing film formation film 15a and the unhardened-resin reinforcement film formation film 31a are simultaneously hardened, the sealing film 15 and the reinforcement film 31 are formed as shown in FIG. 14. After the above described procedures, by performing procedures similar to those in the second example of the manufacturing method, a plurality of semiconductor devices shown in FIG. 1 is obtained.

As described above, in the third example of the manufacturing method, the unhardened-resin sealing film formation film 15a and the unhardened-resin reinforcement film formation film 31a are simultaneously hardened. Therefore, the number of procedures is reduced. In addition, the unhardened-resin sealing film formation film 15a and the unhardened-resin reinforcement film formation film 31a are simultaneously hardened in a state where the unhardened-resin reinforcement film formation film 31a is formed on the bottom surface of the semiconductor wafer 21 and the unhardened-resin sealing film formation film 15a is formed on the top surface side of the semiconductor wafer 21, namely in a state where the structure of the semiconductor wafer 21 in the thickness direction is as symmetrical as possible. Therefore, the semiconductor wafer 21 is less likely to warp.

Note that, in the case where the initial thickness of the semiconductor wafer 21 shown in FIG. 2 is relatively thick and the depth of the second groove shown in FIG. 7 is relatively deep, there is a possibility that the semiconductor wafer 21 breaks during the formation of the second groove 27 using the blade 26, and that the liquid resin used to form the side-section protective film 17 does not infallibly fill the second groove 27 to the bottom. Therefore, next, an embodiment will be described that solves such problems.

Second Embodiment

Figure 22:
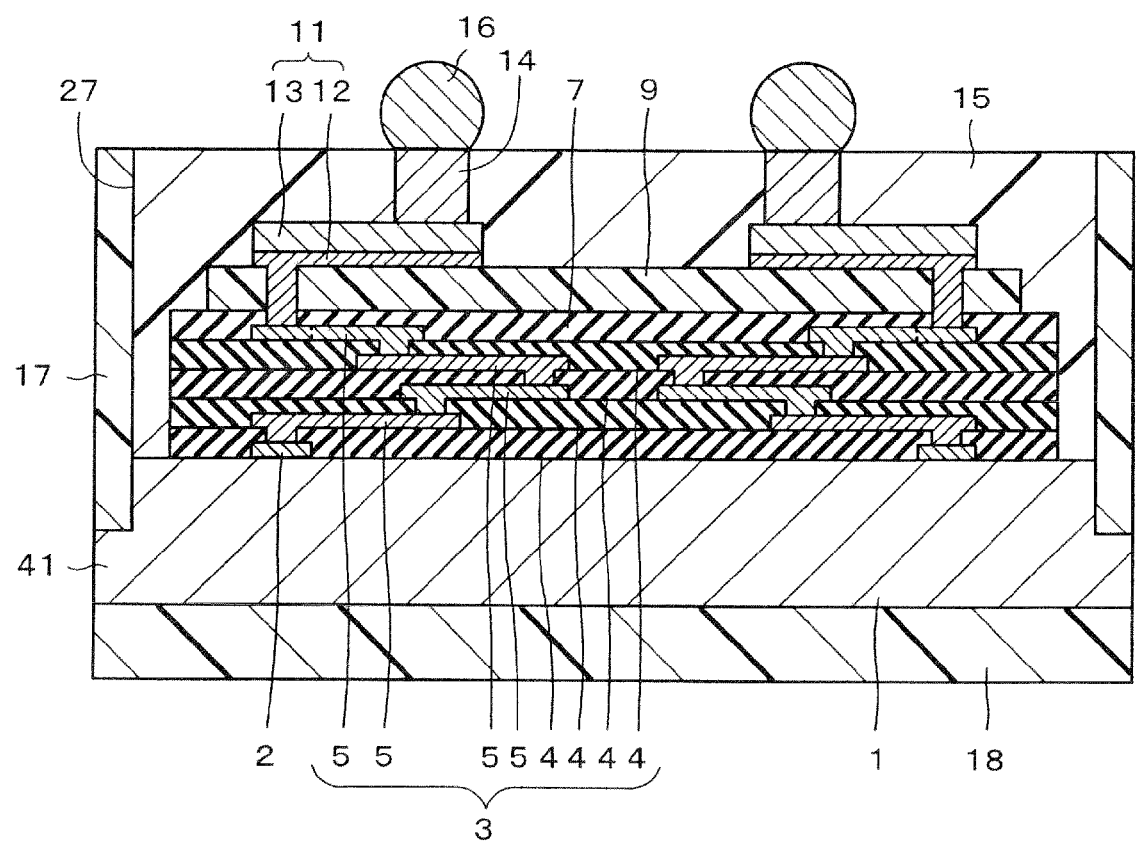
FIG. 22 is a cross-sectional view of a semiconductor device according to a second embodiment of the present invention.
Figure 23:
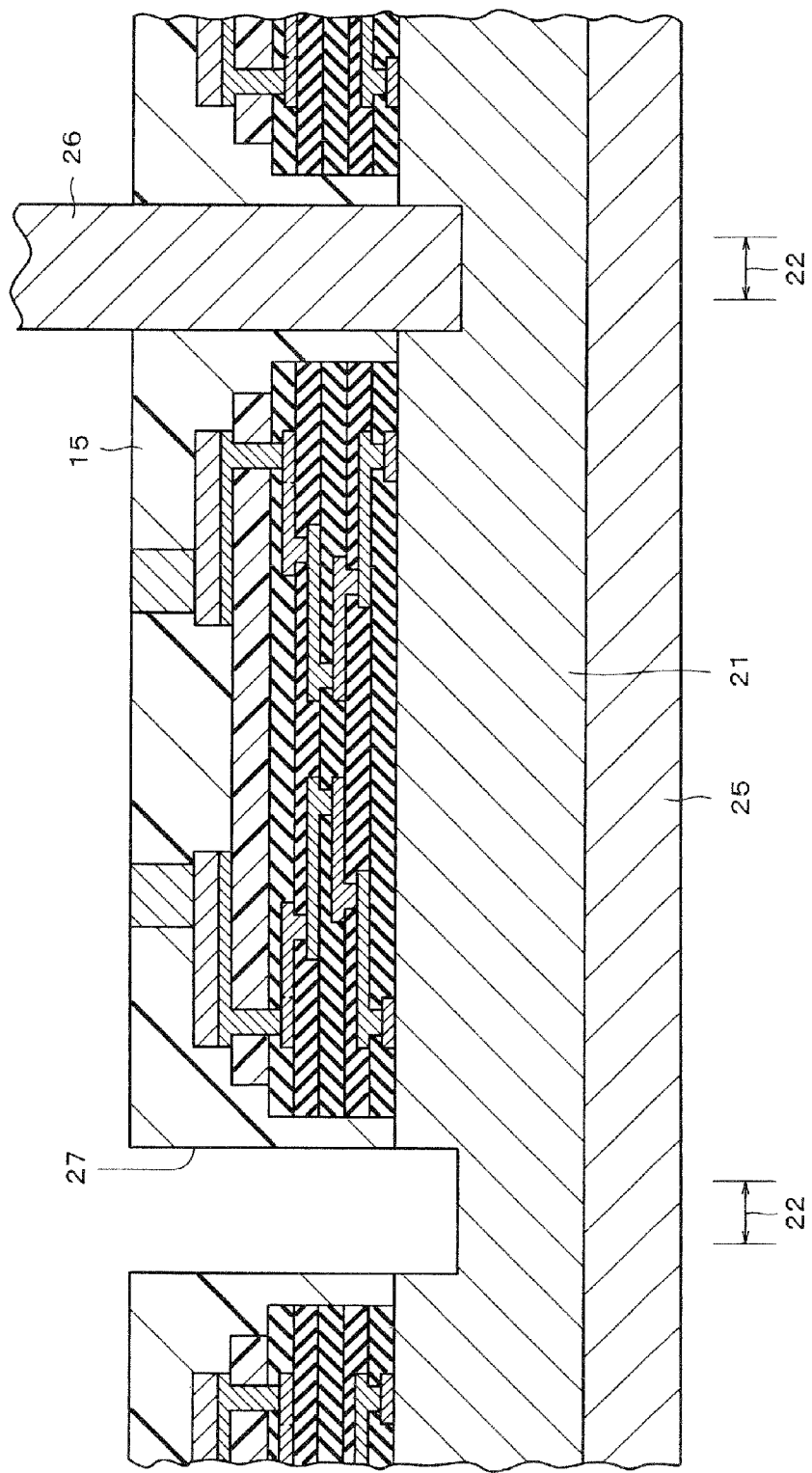
FIG. 23 is a cross-sectional view of a predetermined procedure in an example of a manufacturing method of the semiconductor device shown in FIG. 22.

FIG. 22 is a cross-sectional view of a semiconductor device according to the second embodiment of the present invention. This semiconductor device differs from the semiconductor device shown in FIG. 1 in that, as a result of the depth of the second groove 27 being shallower to a certain extent than that shown in FIG. 7, a projection 41 is provided in the lower section of the peripheral side surface of the silicon substrate 1, the side surface of the projection 41 is externally exposed such as to be flush with the side surface of the side-section protective film 17, and the lower-layer protective film 18 is provided on the bottom surface of the silicon substrate 1 including the projection 41.

Next, an example of a manufacturing method of the semiconductor device will be described. In this instance, after the procedure shown in FIG. 6, as shown in FIG. 14, the blade 26 is used for half-cutting from the top surface side of the sealing film 15 in the area including the dicing street 22 and both sides of the dicing street 22 to the middle of the semiconductor wafer 21, thereby forming the straight-shaped second groove 27. In this instance, the depth of the second groove 27 is shallower to a certain extent than that shown in FIG. 7. As a result, compared to the manufacturing method according to the first embodiment, the semiconductor wafer 21 is less likely to crack during the formation of the second groove 27 using the blade 26.

Figure 24:
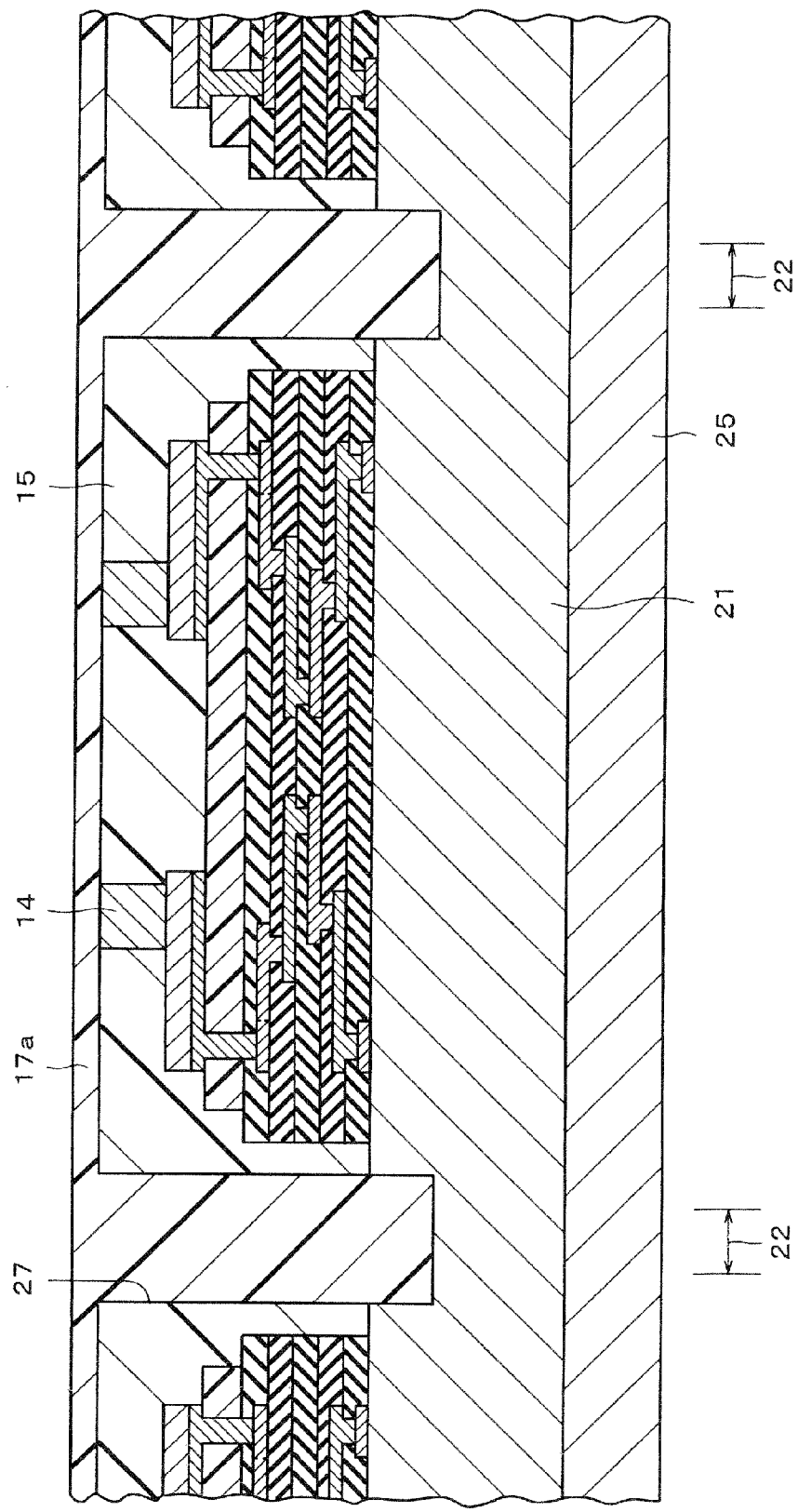
FIG. 24 is a cross-sectional view of a procedure subsequent to that in FIG. 23.

Next, as shown in FIG. 24, the side-section protective film formation film 17a is formed within the second groove 27 and the top surface of the sealing film 15 including the top surface of the columnar electrode 14. In this instance, since the depth of the second groove 27 is shallower to a certain extent than that according to the first embodiment, it is ensured that the liquid resin used to form the side-section protective film formation film 17a fills the second groove 27 to the bottom.

Figure 25:
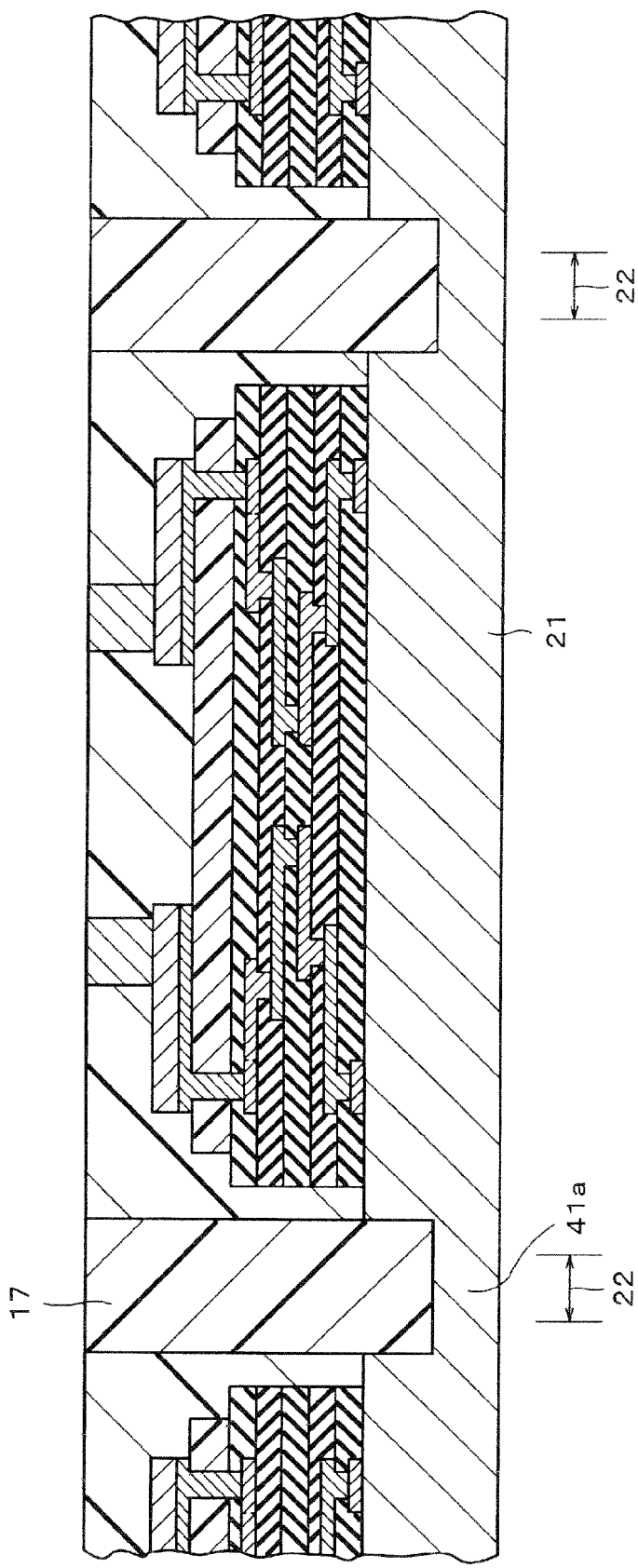
FIG. 25 is a cross-sectional view of a procedure subsequent to that in FIG. 24.

Next, after the dicing tape 25 peeling procedure, the side-section protective film formation film 17a grinding procedure, and the semiconductor wafer 21 grinding procedure are performed, a structure shown in FIG. 25 is obtained. In this instance, the semiconductor wafer 21 grinding procedure is performed to the extent that the side-section protective film 17 formed within the second groove 27 is not exposed. As a result, the semiconductor wafer 21 is not separated into individual silicon substrates 1, and the semiconductor wafer 21 at the section where the second groove 27 is provided remains as a projection formation section 41a.

Figure 26:
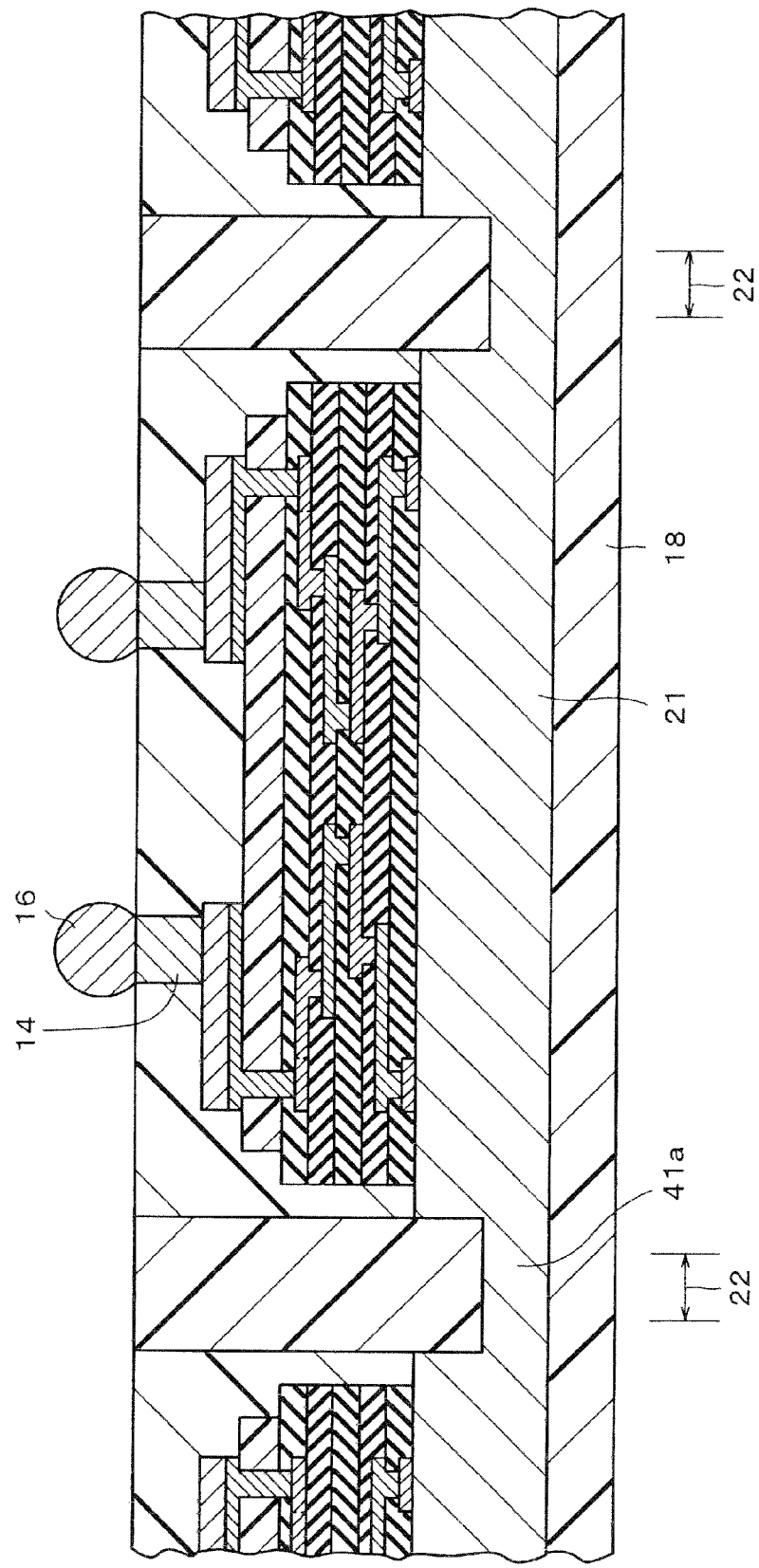
FIG. 26 is a cross-sectional view of a procedure subsequent to that in FIG. 25.
Figure 27:
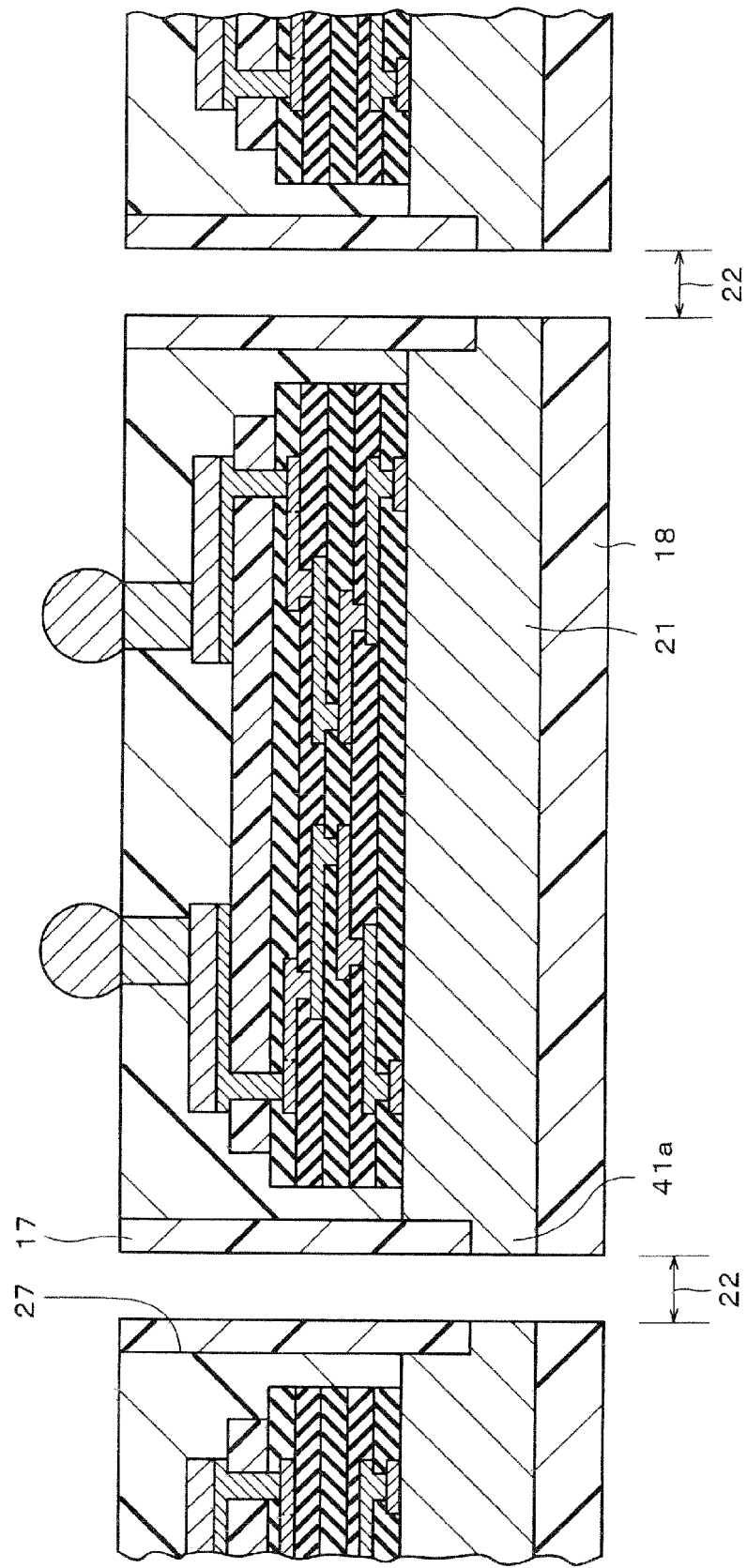
FIG. 27 is a cross-sectional view of a procedure subsequent to that in FIG. 26.

Next, as shown in FIG. 26, the lower-layer protective film 18 is formed on the bottom surface of the semiconductor wafer 21 including the projection formation section 41a by, for example, a resin sheet made of organic resin such as epoxy system resin being adhered. The solder ball 16 is then formed on the top surface of the columnar electrode 14. Next, as shown in FIG. 27, the side-section protective film 17, the projection formation section 41a of the semiconductor wafer 21, and the lower-layer protective film 18 are cut along the dicing street 22 in the center of the second groove 27. Consequently, a plurality of semiconductor devices shown in FIG. 22 is obtained.

Third Embodiment

Figure 28:
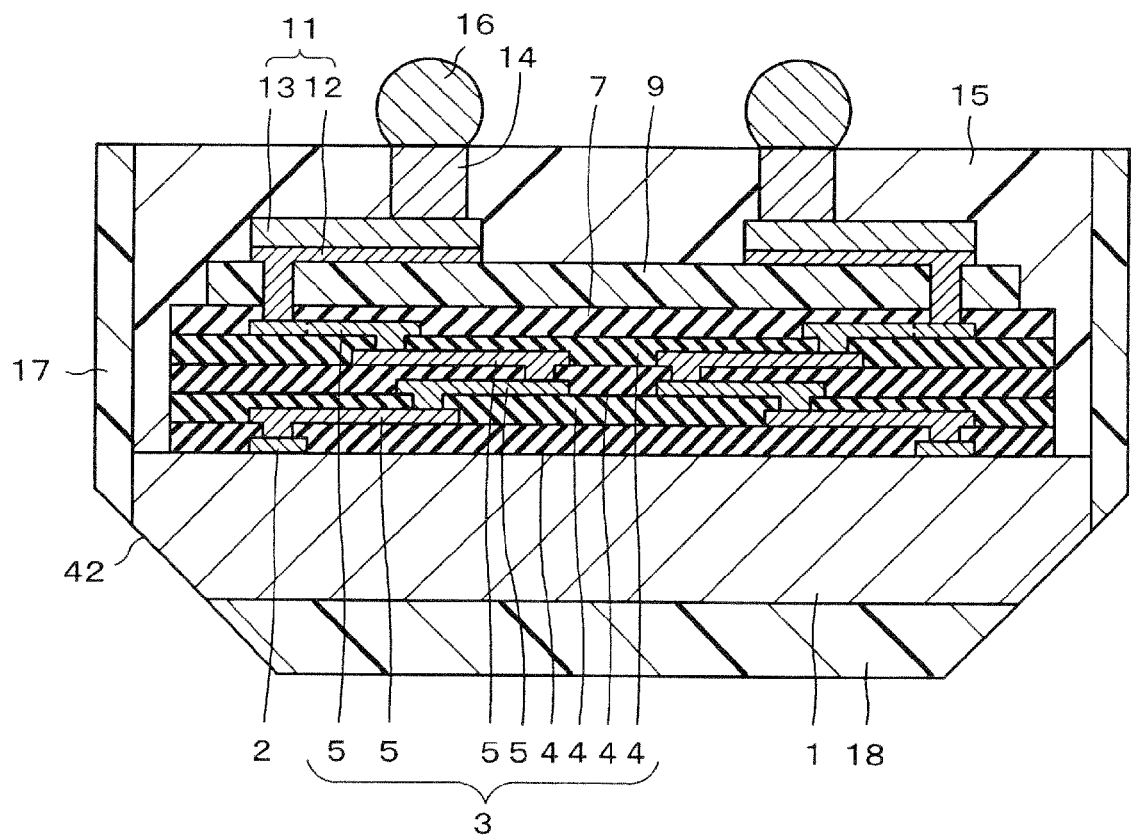
FIG. 28 is a cross-sectional view of a semiconductor device according to the third embodiment of the present invention.

FIG. 28 is a cross-sectional view of a semiconductor device according to the third embodiment of the present invention.

This semiconductor device differs from the semiconductor device shown in FIG. 1 in that an inclined section 42 is formed on the bottom surface periphery of the silicon substrate 1 including the lower-layer protective film 18 and the lower section of the side-section protective film 17. The planar area of the inclined section 42 becomes smaller in the downward direction.

Figure 29:
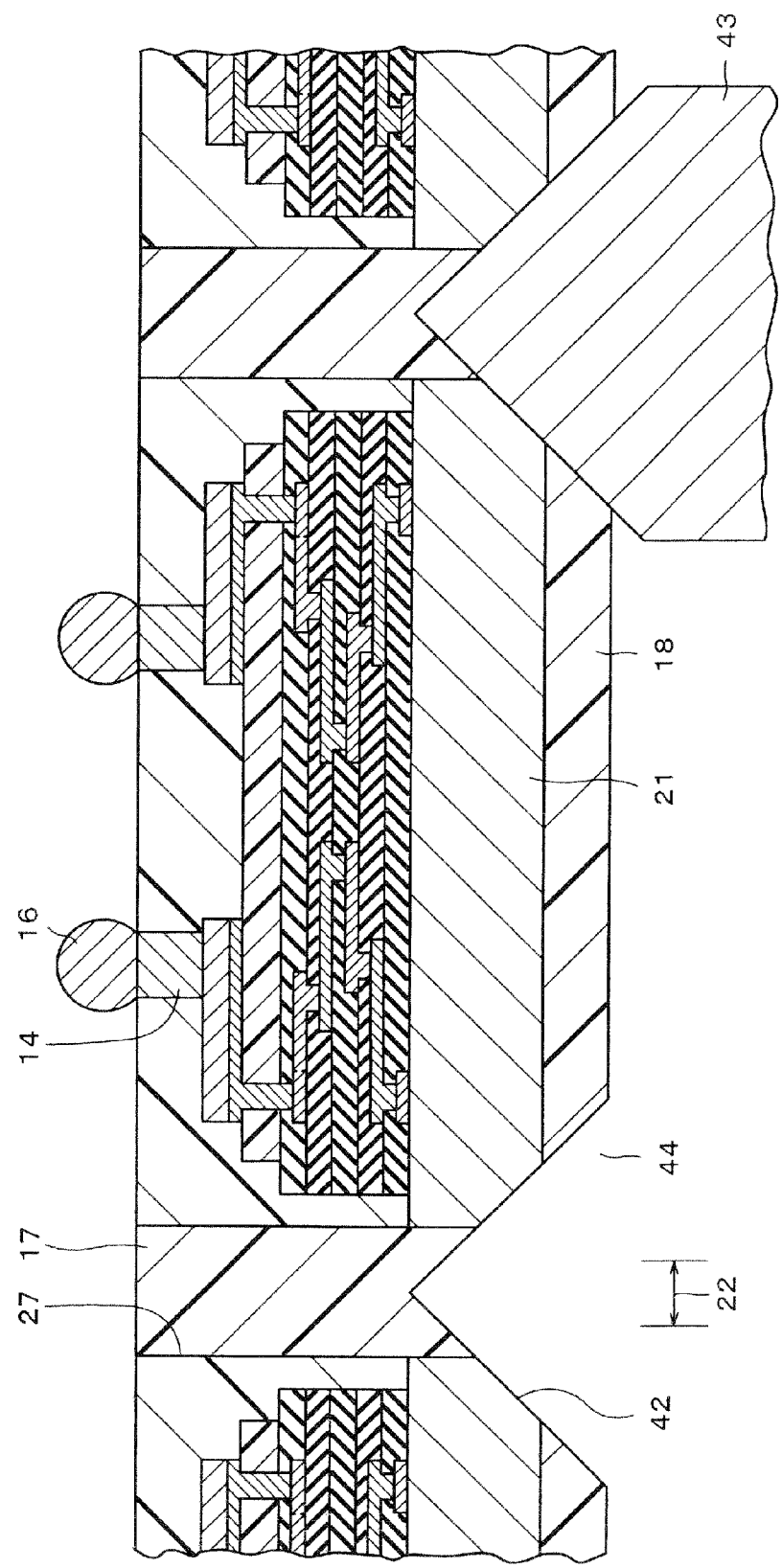
FIG. 29 is a cross-sectional view of a predetermined procedure in an example of a manufacturing method of the semiconductor device shown in FIG. 28.
Figure 30:
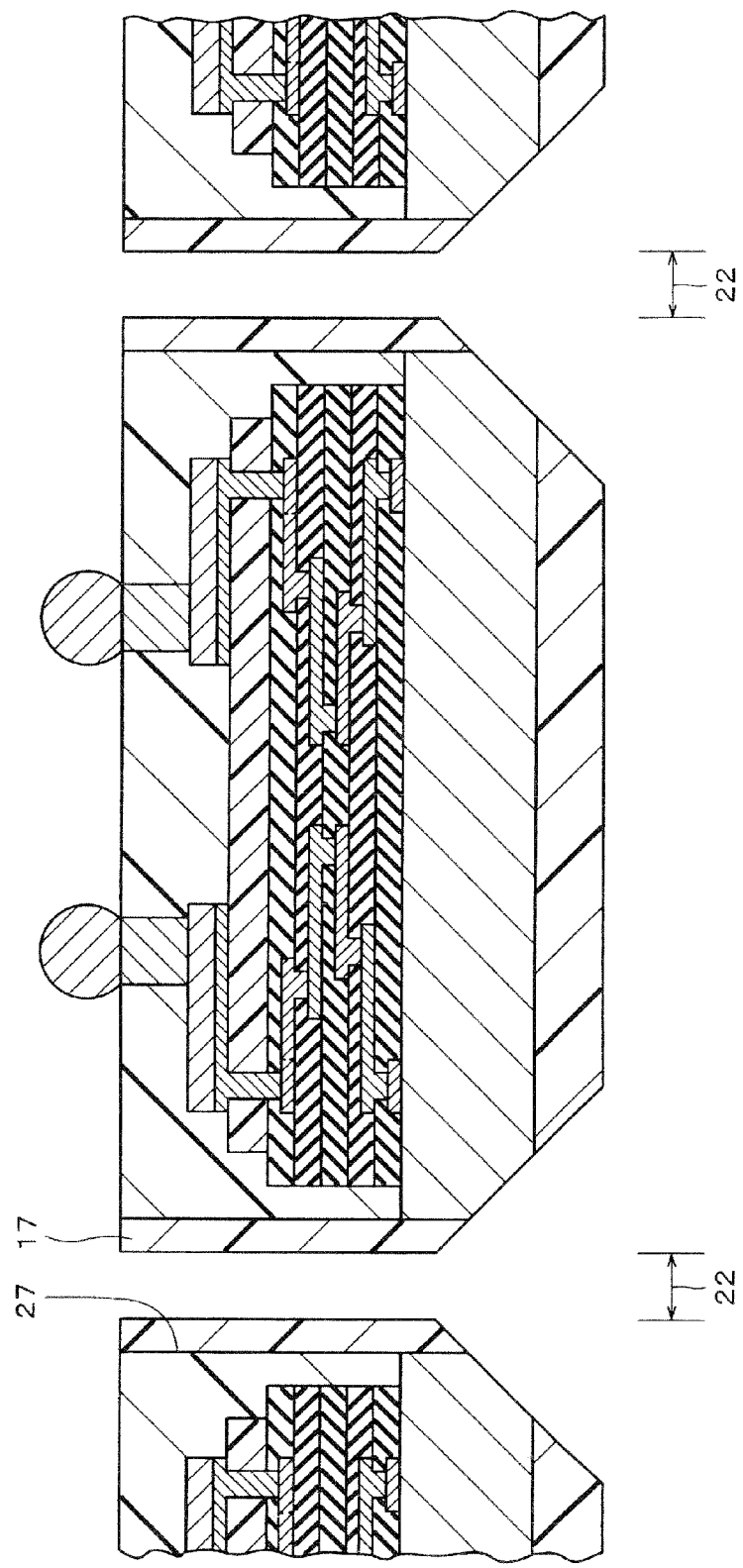
FIG. 30 is a cross-sectional view of a procedure subsequent to that in FIG. 29.

Next, an example of a manufacturing method of this semiconductor device will be described. In this instance, after the procedure shown in FIG. 11, as shown in FIG. 29, a blade 43 is prepared. The blade 43 is a disk-shaped grindstone, and the edge of the blade 43 has a cross-section of roughly V-shape. Next, the tip section of the blade 43 is positioned at the center of the dicing street 22, and the lower-layer protective film 18 is diced. Dicing is performed until the tip section of the blade 43 reaches the mid-section of the side-section protective film 17 such as, but not limited to, the top surface of the silicon substrate 1. As a result of the dicing, a third groove 44 having a cross section of roughly inverted V-shape is formed in the lower-layer protective film 18, the silicon substrate 1, and the side-section protective film 17, and the inclined section 42 is formed in the lower section of the silicon substrate 1. Next, as shown in FIG. 30, the side-section protective film 17 is cut along the dicing street 22 in the center of the second groove 27. As a result, a plurality of semiconductor devices shown in FIG. 28 is obtained.

Note that, for example, in the semiconductor device shown in FIG. 22, the side surface of the projection section 41 of the silicon substrate 1 is flush with the side surface of the side-section protective film 17 and is externally exposed. Therefore, there is a possibility that the protection of the side surface of the silicon substrate 1 including the projection 41 is insufficient. Thus, next, an embodiment will be described that solves this problem.

Fourth Embodiment

Figure 31:
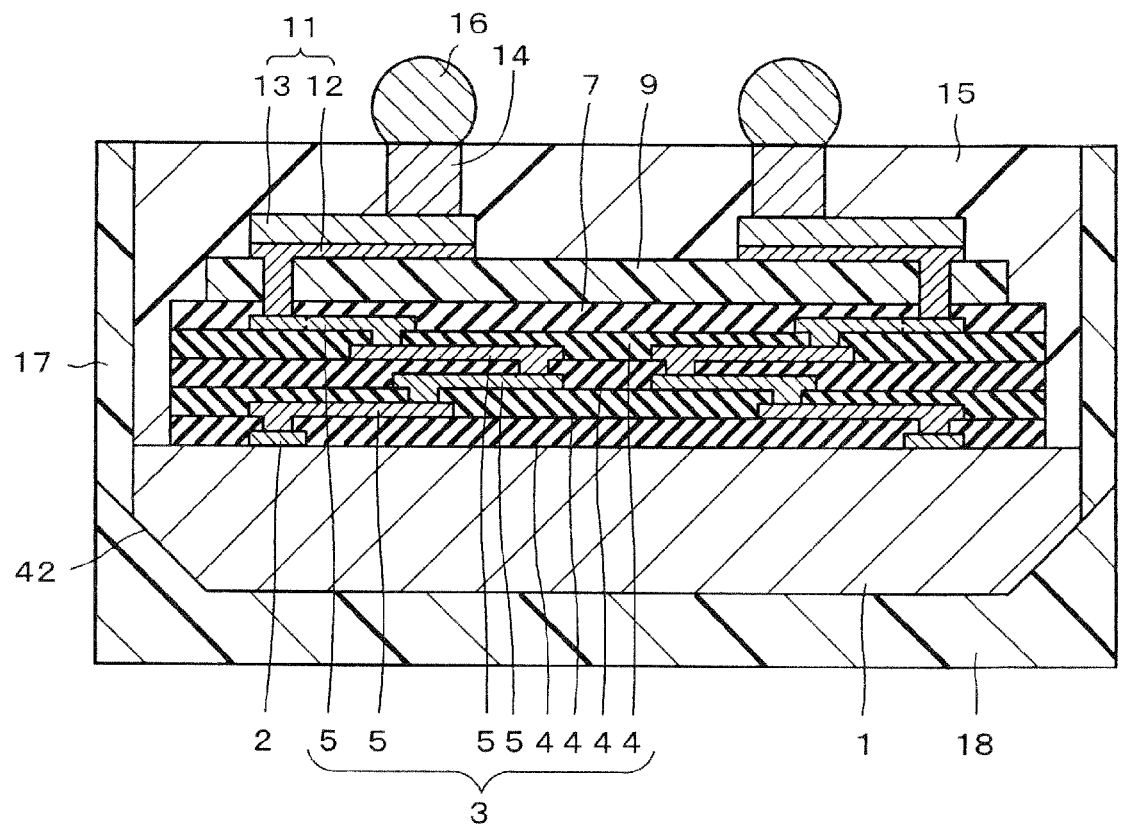
FIG. 31 is a cross-sectional view of a semiconductor device according to the fourth embodiment of the present invention.

FIG. 31 is a cross-sectional view of a semiconductor device according to the fourth embodiment of the present invention.

This semiconductor device differs from the semiconductor device shown in FIG. 22 in that the projection section 41 on the bottom surface periphery of the silicon substrate 1 is removed, and instead, the inclined section 42 of which the planar area becomes smaller in the downward direction is formed. In addition, the inclined section 42 is covered by the lower-layer protective film 18. Note that, although the semiconductor device according to the fourth embodiment shown in FIG. 31 differs from the semiconductor device according to the third embodiment shown in FIG. 28 in that the inclined section 42 is covered by the lower-layer protective film 18, in the manufacturing method according to the third embodiment shown in FIG. 29, the lower-layer protective film 18 covering the bottom surface of the silicon substrate 1 is formed before the inclined section 42 is formed, and therefore additional procedures are required to cover the inclined section 42 with insulating film.

Figure 32:
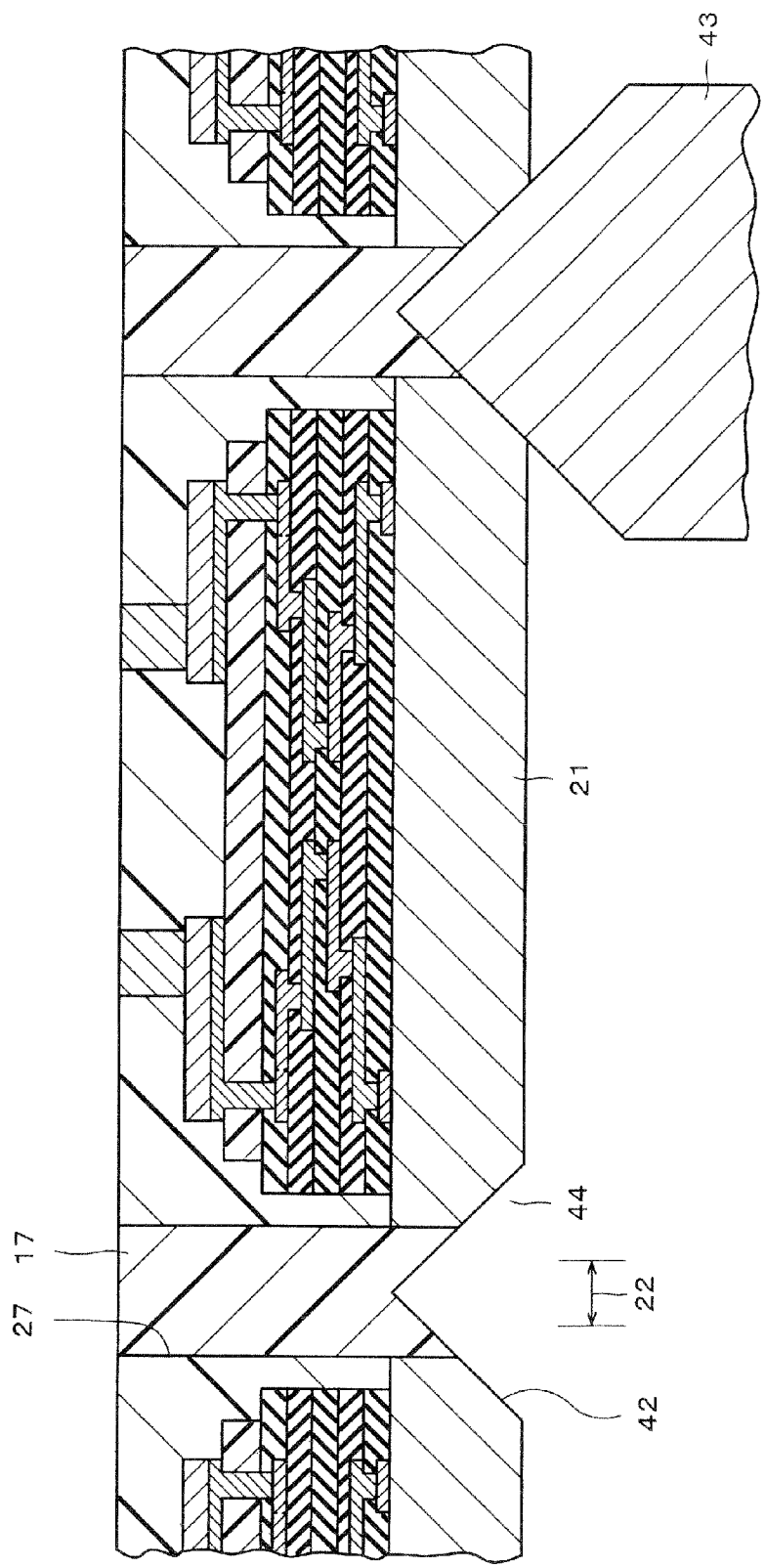
FIG. 32 is a cross-sectional view of a predetermined procedure in an example of a manufacturing method of the semiconductor device shown in FIG. 31.

Thus, an example of the manufacturing method of the semiconductor device according to the fourth embodiment will be described based on the manufacturing method of the semiconductor device according to the second embodiment. In this instance, after the procedure shown in FIG. 25, as shown in FIG. 32, the blade 43 is prepared. The blade 43 is a disk-shaped grindstone, and the edge of the blade 43 has a cross-section of roughly V-shape. Next, the tip section of the blade 43 is positioned at the center of the dicing street 22, and the projection formation section 41a of the silicon substrate 1 is diced. Dicing is performed until the tip section of the blade 43 reaches the mid-section of the side-section protective film 17 such as, but not limited to, the top surface of the silicon substrate 1. As a result of the dicing, the third groove 44 having a cross section of roughly inverted V-shape is formed in the silicon substrate 1 and the side-section protective film 17, and the inclined section 42 is formed in the lower section of the silicon substrate 1.

Figure 33:
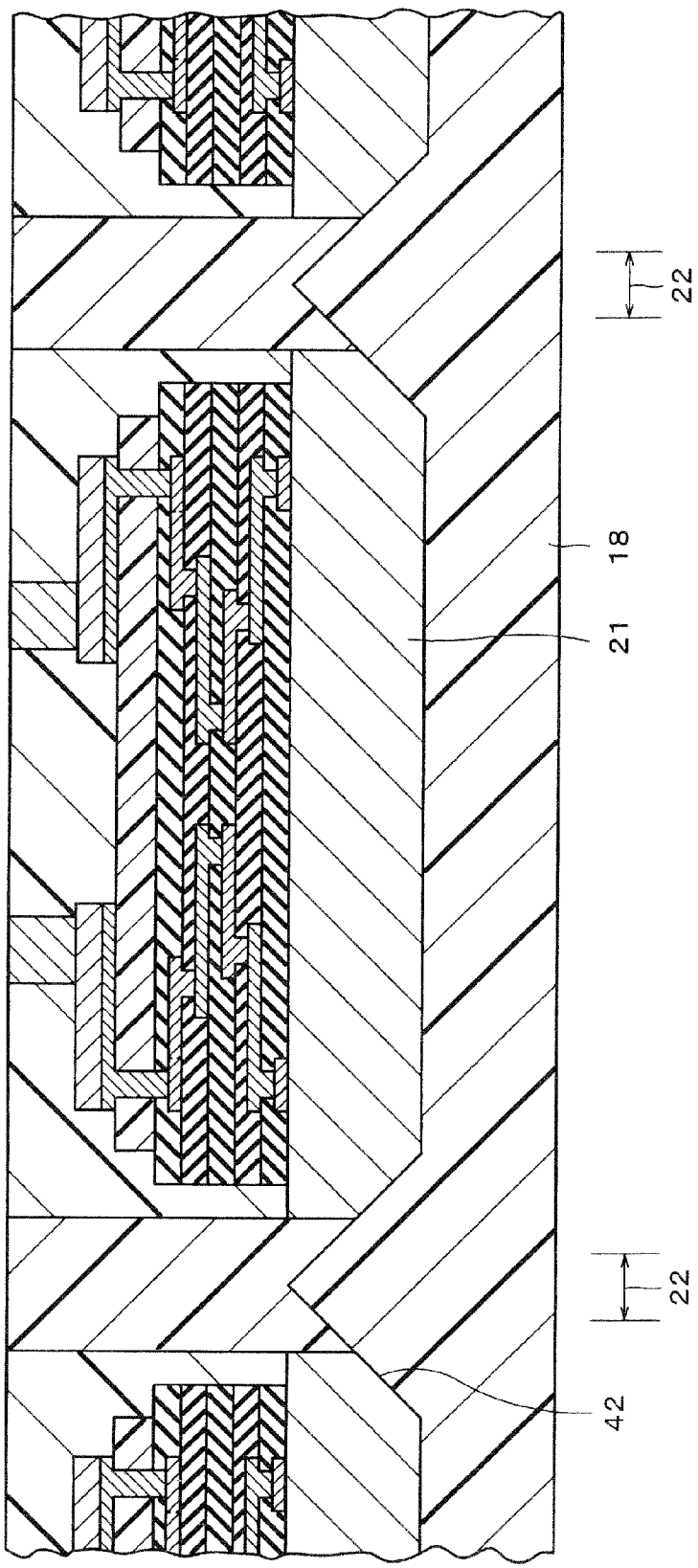
FIG. 33 is a cross-sectional view of a procedure subsequent to that in FIG. 32.

Next, as shown in FIG. 33, the lower-layer protective film 18 made of organic resin such as epoxy system resin is formed on the bottom surface of the semiconductor wafer 21, including within the third groove 44. In this instance, a resin sheet may be adhered to form the lower-layer protective film 18. Alternatively, liquid resin may be applied by the screen-printing method, the spin-coating method, or the like. The lower-layer protective film 18 provided on the bottom surface of the semiconductor wafer 21 is thicker to a certain extent than the lower-layer protective film 18 provided on the bottom layer of the silicon substrate 1 in FIG. 31.

Figure 34:
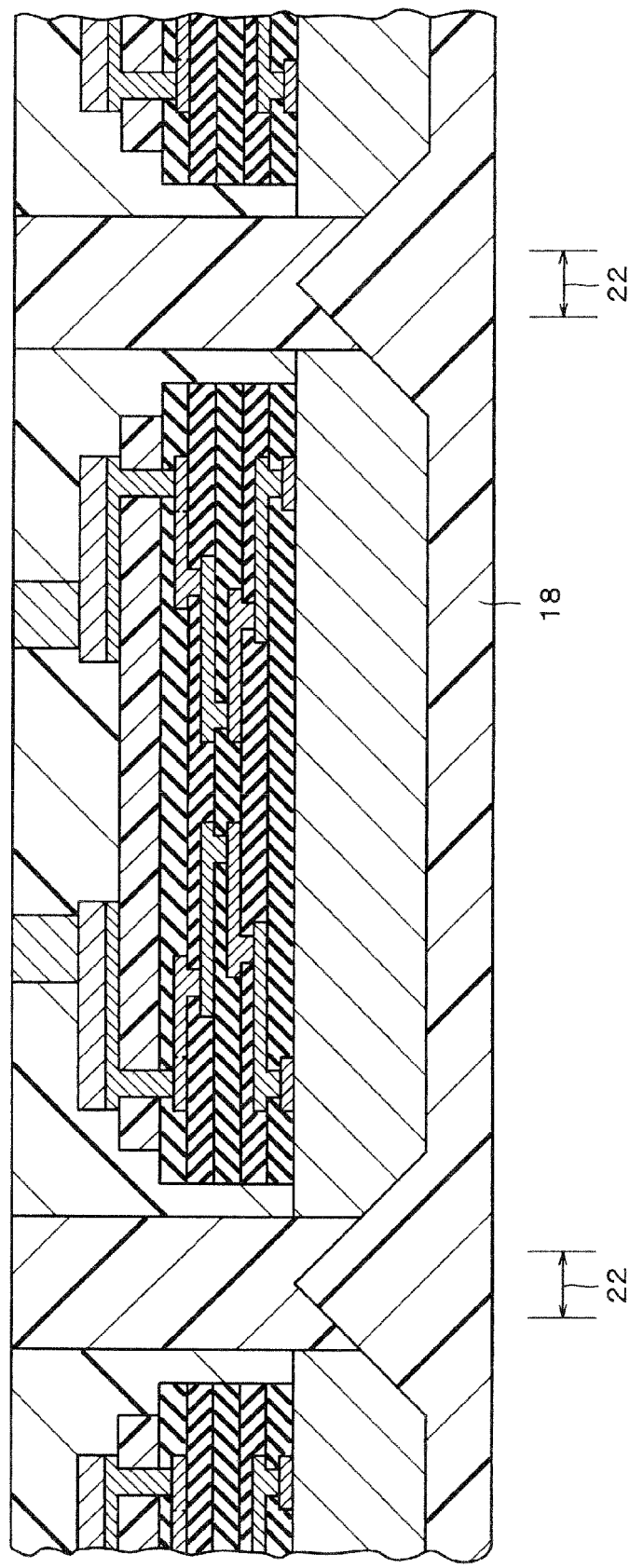
FIG. 34 is a cross-sectional view of a procedure subsequent to that in FIG. 33.
Figure 35:
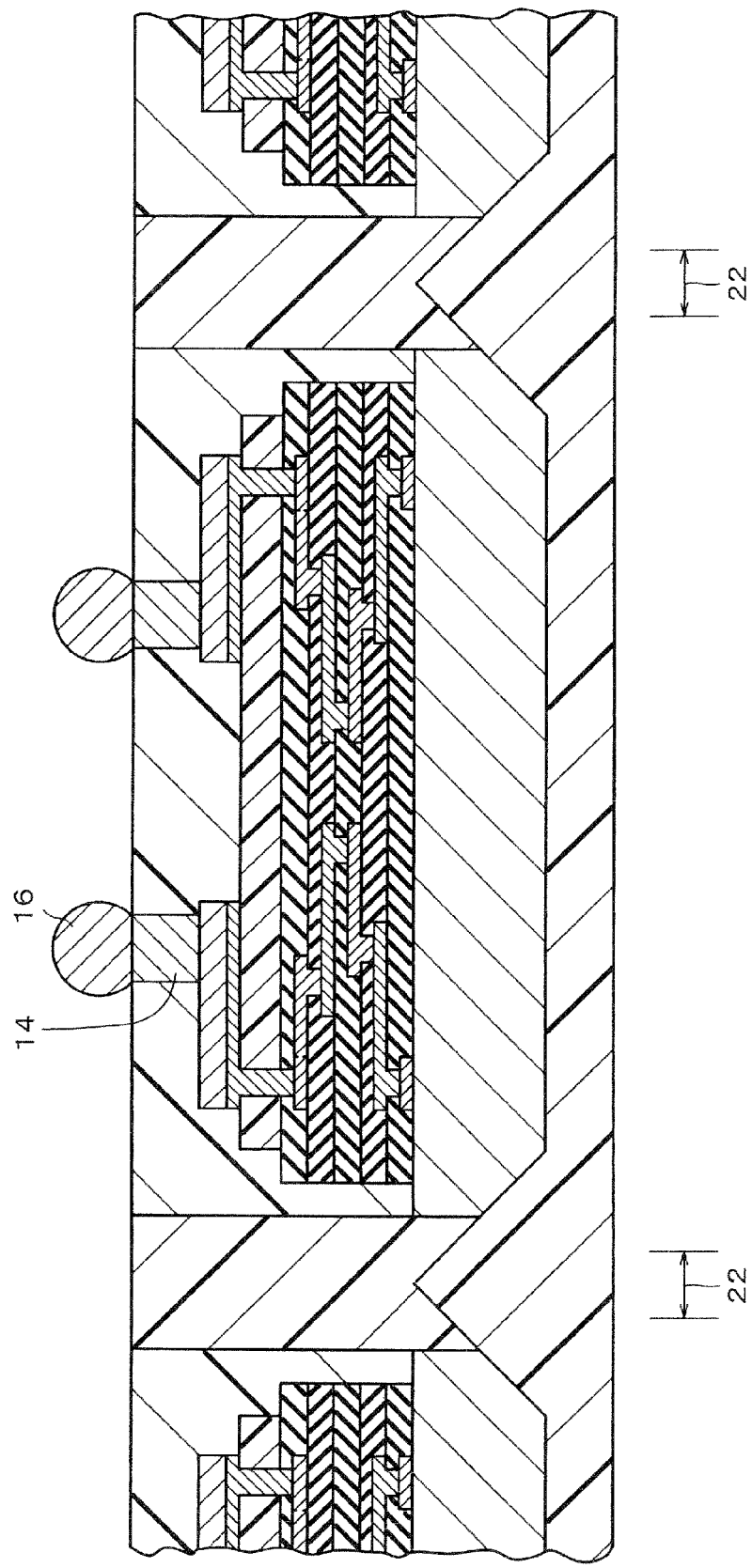
FIG. 35 is a cross-sectional view of a procedure subsequent to that in FIG. 34.
Figure 36:
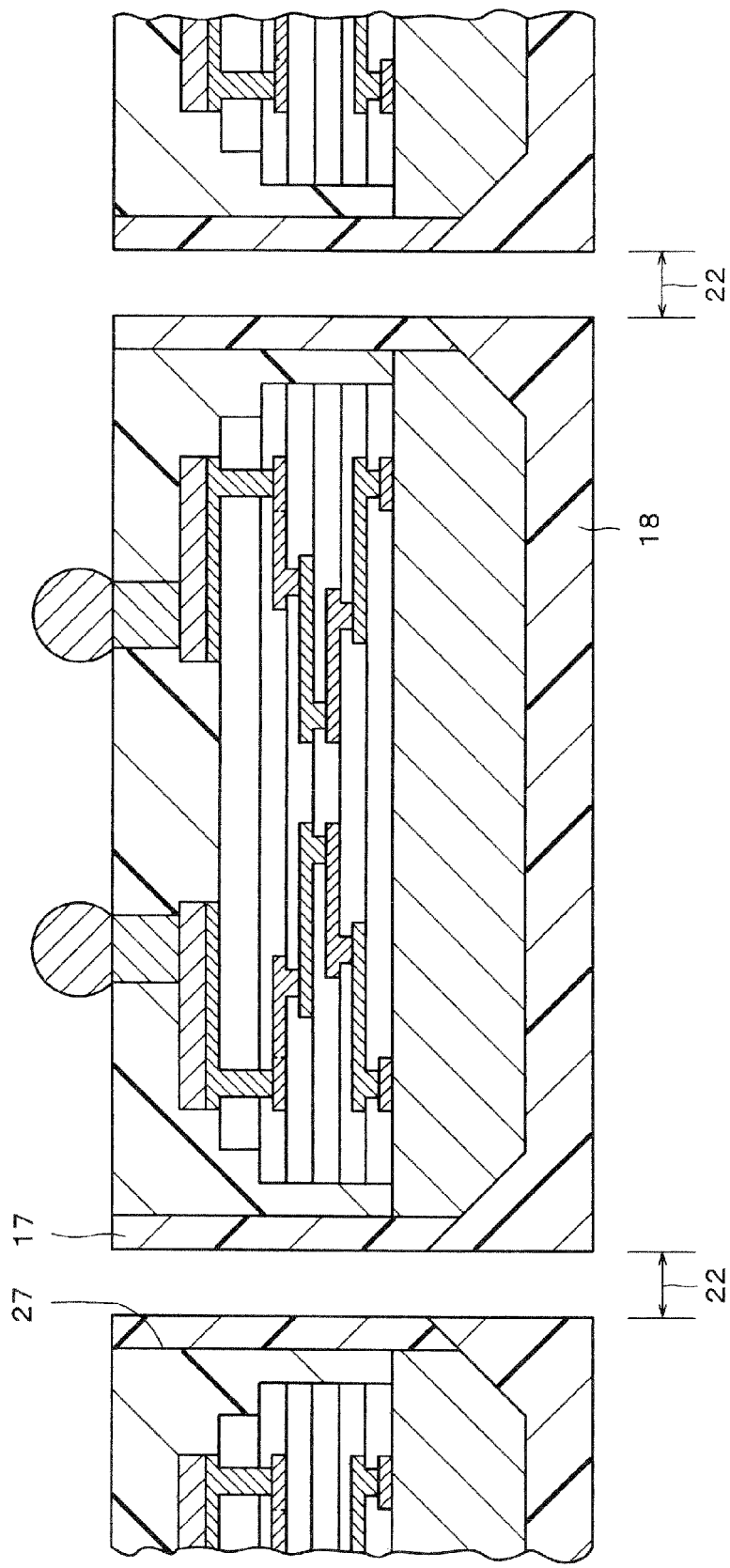
FIG. 36 is a cross-sectional view of a procedure subsequent to that in FIG. 35.

Next, as shown in FIG. 34, the bottom surface side of the lower-layer protective film 18 is ground accordingly, and the thickness of the lower-layer protective film 18 is reduced thereby. Next, as shown in FIG. 35, the solder ball 16 is formed on the top surface of the columnar electrode 14. Then, as shown in FIG. 36, when the side-section protective film 17 and the lower-layer protective film 18 are cut along the dicing street 22 in the center of the second groove 27, a plurality of semiconductor devices shown in FIG. 31 is obtained.

In the semiconductor device obtained as described above, the inclined section 42 is formed on the bottom surface periphery of the silicon substrate 1 and the lower section of the side-section protective film 17, and the inclined section 42 is covered by the lower-layer protective film 18. Therefore, the lower section of the side surface of the silicon substrate 1 is protected by the lower-layer protective film 18.

Fifth Embodiment

Figure 37:
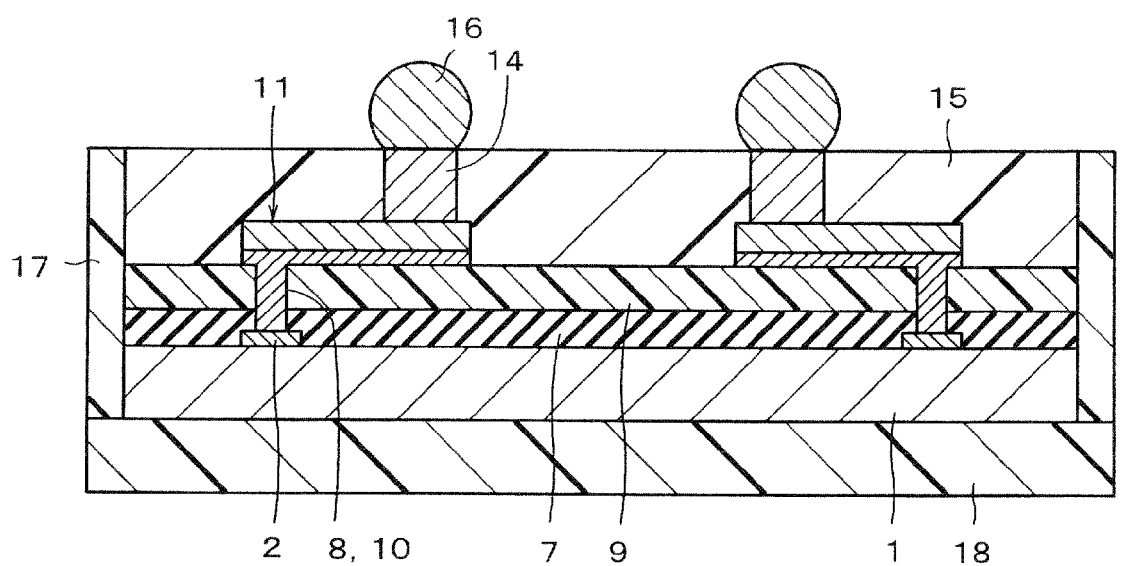
FIG. 37 is a cross-sectional view of a semiconductor device according to the fifth embodiment of the present invention.

According to the above-described embodiments, the semiconductor device has a structure in which the low dielectric constant film and wiring laminated structure section 3 is formed on top of the silicon substrate 1 including the connection pads 2. However, the present invention may also be applied to a structure that does not include the low dielectric constant film and wiring laminated structure section 3. For example, the present invention may be applied to a semiconductor device such as that according to the fifth embodiment of the present invention shown in FIG. 37.

In the semiconductor device, the passivation film 7 and the upper-layer protective film 9 are provided on the top surface of the silicon substrate 1, and the upper-layer wiring 11 is provided on the top surface of the upper-layer protective film 9 so as to be connected to the connection pad 2 via the openings 8 and 10 in the passivation film 7 and the upper-layer protective film 9. In addition, the side-section protective film 17 is provided on the side surfaces of the sealing film 15, the upper-layer protective film 9, the passivation film 7, and the silicon substrate 1, and the lower-layer protective film 18 is provided on the bottom surfaces of the silicon substrate 1 and the side-section protective film 17.

Other Embodiments

According to the above-described embodiments, the semiconductor device has a structure in which the upper-layer wiring 11 is formed on top of the upper-layer protective film 9, and the columnar electrode 14 is formed on top of the connection pad section of the upper-layer wiring 11. However, the present invention may also be applied to a structure in which only the connection pad section is formed on the upper-layer protective film 9, and an external connection bump electrode, such as the columnar electrode 14 and the solder ball 16, is formed on top of the connection pad section.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a low dielectric constant film and wiring laminated structure section having a laminated structure including a low-dielectric film having a dielectric constant of 3.0 or less and a wiring, which is provided on one surface of the semiconductor substrate excluding a periphery thereof;
   an insulating film provided on the low dielectric constant film and wiring laminated structure section;
   an electrode connection pad section provided on the insulating film;
   an external connection bump electrode provided on the electrode connection pad section;
   a sealing film made of organic resin provided on the insulating film around a periphery of the external connection bump electrode, a side surface of the insulating film, and a side surface of the low dielectric constant film and wiring laminated structure section;
   a side-section protective film made of organic resin provided on a side surface of the sealing film and at least an upper section of a side surface of the semiconductor substrate; and
   a lower-layer protective film made of organic resin provided on at least a bottom surface of the semiconductor substrate.

2. The semiconductor device according to claim 1, wherein a projection section exposed from the side-section protective film is provided in a lower section of the side surface of the semiconductor substrate.

3. The semiconductor device according to claim 1, wherein the semiconductor substrate has an inclined section on a bottom surface periphery thereof.

4. The semiconductor device according to claim 3, wherein the inclined section on the bottom surface periphery of the semiconductor substrate is covered by the lower-layer protective film.

5. The semiconductor device according to claim 1, wherein the side-section protective film is provided over an entire side surface of the semiconductor substrate.

6. The semiconductor device according to claim 1, wherein a bottom surface of the side-section protective film is covered by the lower-layer protective film.

7. The semiconductor device according to claim 1, wherein the insulating film includes a passivation film made of inorganic resin, and an upper-layer protective film made of organic resin which is provided on the passivation film.

8. The semiconductor device according to claim 7, wherein side surfaces of the passivation film and the low dielectric constant film and wiring laminated structure section are substantially flush with each other.

9. The semiconductor device according to claim 8, wherein the side surface of the upper-layer protective film is positioned further inward than the side surface of the passivation film.

10. The semiconductor device according to claim 8, wherein the side surfaces of the upper-layer protective film, the passivation film, and the low dielectric constant film and wiring laminated structure section are substantially flush with one another.

11. The semiconductor device according to claim 1, wherein an upper-layer wiring including the electrode connection pad section is formed on the insulating film.

12. The semiconductor device according to claim 1, wherein elasticity and glass transition temperature of the side-section protective film are lower than elasticity and glass transition temperature of the sealing film.

13. The semiconductor device according to claim 12, wherein glass transition temperature of the low-dielectric film is 400 degrees Celsius or higher.

* * * * *